United States Patent
Damadian et al.

(10) Patent No.: US 6,346,816 B1
(45) Date of Patent: *Feb. 12, 2002

(54) METHOD AND APPARATUS FOR MAGNETIC RESONANCE IMAGING

(75) Inventors: Raymond V. Damadian, Woodbury; Gordon Danby, Wading River; James J. Persoons, East Northport, all of NY (US)

(73) Assignee: Fonar Corporation, Melville, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/980,079

(22) Filed: Nov. 26, 1997

(51) Int. Cl.⁷ .................................................. G01V 3/00
(52) U.S. Cl. ........................................ 324/319; 324/320
(58) Field of Search ................................ 324/319, 320, 324/318, 322, 300; 335/296, 299

(56) References Cited

U.S. PATENT DOCUMENTS

| | | | |
|---|---|---|---|
| 4,636,756 A | 1/1987 | Ito et al. ...................... 333/202 |
| 4,672,346 A | * 6/1987 | Miyamoto et al. ........... 335/296 |
| 4,673,882 A | * 6/1987 | Buford ......................... 324/320 |
| 4,875,485 A | 10/1989 | Matsutani .................... 128/653 |

* cited by examiner

*Primary Examiner*—Louis Arana
(74) *Attorney, Agent, or Firm*—Morgan & Finnegan, LLP

(57) ABSTRACT

Magnet assembly for use in medical magnetic resonance imaging includes means for increasing flux generation in the gap region to provide the capability of scanning smaller volume regions of a patient at increased levels of scanning resolution. The means for increasing flux generation is mechanical or electromagnetic, is coupled to each of the polar regions and maintains the gap region sufficiently large and unobstructed to allow for access to the patient by several persons during scanning. Tapered outer walls of the polar region proximate the gap region further enhance accessibility to the patient during scanning.

35 Claims, 11 Drawing Sheets

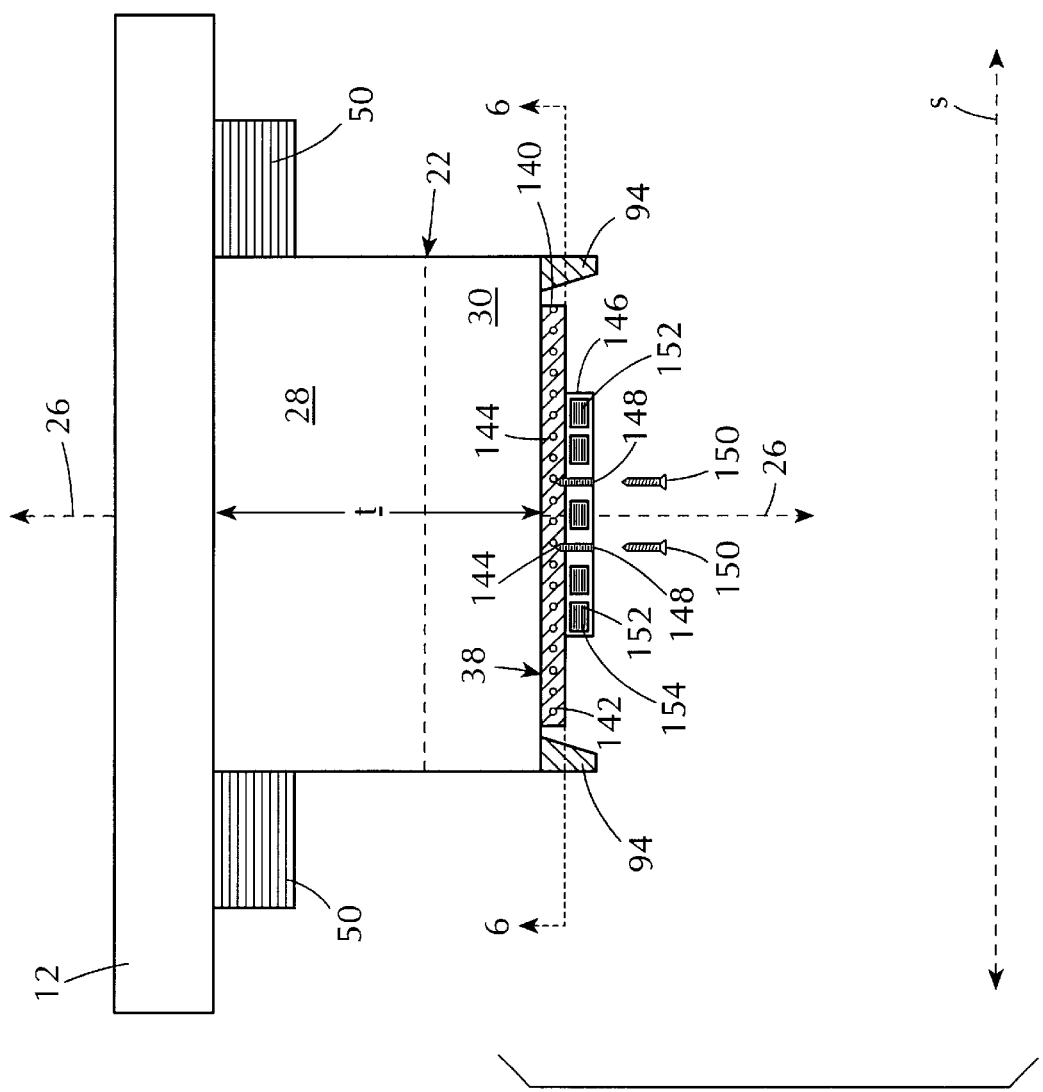

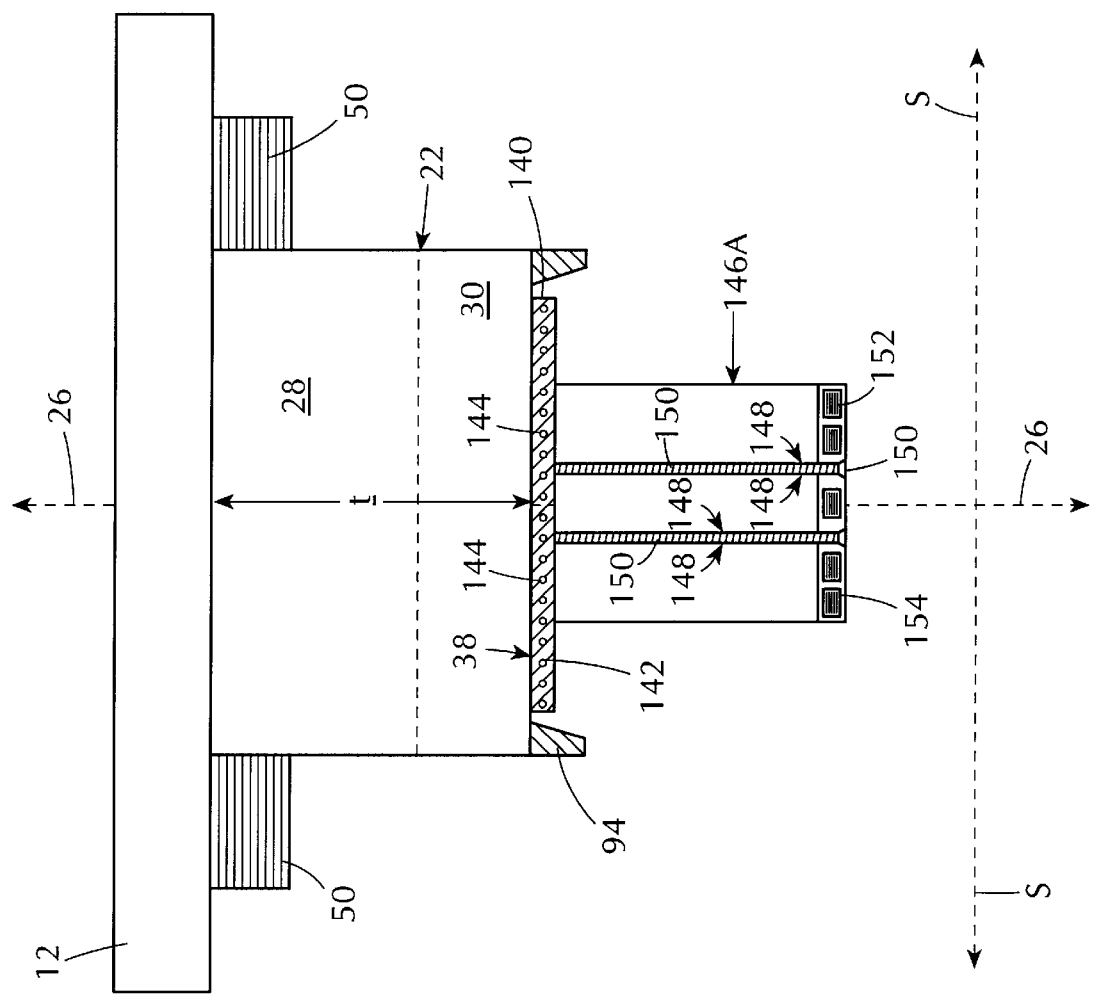

METHOD AND APPARATUS FOR MAGNETIC RESONANCE IMAGING

FIELD OF THE INVENTION

The present invention relates to magnets for medical magnetic resonance imaging, and more particularly, to such magnets having magnetic zoom capabilities and an open configuration that enables magnetic resonance imaging during surgery.

BACKGROUND OF THE INVENTION

Magnetic resonance imaging techniques are currently used to obtain images of various portions of an anatomical region of interest. A magnetic resonance imaging magnet assembly generates magnetic field gradients to spatially encode the nuclear magnetic resonance (NMR) signals from an anatomical region which is positioned in the path of the field gradients. The NMR signals are detected and then processed to obtain images that provide an accurate representation of anatomical features and soft tissue contrast of the region of interest.

Early magnet assemblies for performing magnetic resonance imaging on a patient required that the patient be positioned in a narrow, substantially enclosed gap region. These magnet assemblies induced claustrophobic reactions in the patient and also prevented another person, such as a medical attendant or physician, from having easy access to the patient while a region of the patient was scanned to obtain a magnetic resonance image.

Recently, open type magnetic resonance imaging magnet assemblies have been developed. These open assemblies have a large gap region for receiving a patient, are configured to be less confining and also permit greater access to the patient during scanning. For example, magnet assemblies with open areas on four sides of the patient, such as those described in U.S. patent application Ser. No. 07/993,072, filed Dec. 18, 1992, and U.S. patent application, MRI APPARATUS, Gordon Danby, John Linardos, Jevan Damadian and Raymond V. Damadian, filed Nov. 21, 1997, both assigned to the assignee of the present invention and incorporated by reference herein, have been proposed which provide for imaging volumes large enough to conduct surgery therein.

U.S. Ser. No. 07/993,072 also discloses, magnet assemblies have been configured in the form of a room with only the polar regions of the magnet visible in the room, such as projecting from either the horizontal or vertical walls of the room. These magnet assemblies further reduce claustrophobic stress for the patient and allow others even greater access to the patient during scanning. In particular, these magnet assemblies provide that one or more persons can have access to the patient while the patient is positioned between the poles of the magnet assembly during scanning. This accessibility enables a physician to perform surgical procedures on the patient that are guided by the images obtained from scanning a desired anatomical region of the patient. The images obtained using open magnet assemblies, however, may not necessarily have sufficient resolution to be useful for guiding surgery in an anatomical region, which generally is smaller than the anatomical region that the magnet assembly is scanning.

Therefore, there exists a need for an open magnet assembly for magnetic resonance imaging which allows several persons to have access to a patient while the patient is undergoing scanning and furthermore provides a capability of increasing the resolution of scanning over a more limited region of interest of the patient, as desired, simply and conveniently while maintaining access to the patient substantially unimpeded and without requiring that the patient be moved.

SUMMARY OF THE INVENTION

In accordance with the present invention, a magnet assembly for use in medical magnetic resonance imaging provides a sizable gap region in which a patient can be received and allows for substantially unimpeded access to the patient while the patient is undergoing scanning of any region of interest. The magnet assembly has a capability to scan a first relatively large volume region of the patient at a first scanning resolution and the capability to scan a second, smaller volume region of the patient at higher scanning resolutions than the first scanning resolution.

In a preferred embodiment, the magnet assembly comprises a ferromagnetic yoke configured as a frame and conformed to the structure of an ordinary room. The frame includes a pair of opposing vertical ferromagnetic elements and a pair of opposing pole supports, each of which forms one side of the frame, which is the flux return path. The pole supports support respective ferromagnetic poles which face each other and are axially aligned with each other. Each of the poles includes a first body portion which is adjacent to the pole support and has a rectangular box structure. Each of the poles further includes a second body portion which extends away from the first body portion and terminates at a gap facing surface. The second body portion is a trapezoidal box structure which includes opposing walls which extend from and are in the same plane as the longer sides of the rectangular first body portion and tapered walls which extend towards the center of the pole at the same angle with respect to the shorter walls of the first body portion. The facing surfaces of the respective poles are spaced apart to define a gap region therebetween for receiving a portion of a patient and each have a magnet field gradient coil support mounted thereto. The gap region and the tapered walls of the poles which are in proximity to the gap region provide for open access to the patient during scanning.

In one aspect of the invention, means for increasing magnetic flux generation in the gap region is coupled to each of the poles. Such increasing magnetic flux generation means, or magnetic zoom means, allows for higher resolution scanning of a smaller volume region of a patient in comparison to the scanning resolution and the volume region of the patient which would be scanned, respectively, when the magnetic zoom means is not utilized. The magnetic zoom means in the magnet assembly decreases the distance between the facing surfaces of the structures of the magnet assembly which extend furthest from the respective poles into the gap region, or the gap distance of the magnet assembly, during higher resolution scanning and, alternatively, also during scanning without magnetic zoom, without substantially impeding access to the patient.

The magnetic zoom means comprises a mechanical magnetic zoom means or an electromagnetic magnetic zoom means, or both, and either of these magnetic zoom magnetic zoom means can be provided in the magnet assembly axially or non-axially axially symmetrical about the center of the poles. The mechanical magnetic zoom means is a ferromagnetic structure which extends or is extendible from the facing surface of each pole into the gap region. The electromagnetic magnetic zoom means comprises a support containing a distribution of conducting coils which is coupled to the facing surface of each pole and extends or is extendible into the gap region.

In a preferred embodiment of either magnet assembly, each pole includes a hollowed cylindrical region in which a piston formed from ferromagnetic material is received in tight fitting relation to the surface of the pole which defines the hollowed region. The piston is coupled to a magnetic zoom operating assembly which is coupled to the adjoining pole support. The operating assembly can position each of the pistons simultaneously and identically at a plurality of positions extending into the gap region to provide for higher resolution scanning of a more limited volume region of the patient in comparison to the region defined by the facing surfaces of the poles. The facing end surfaces of the pistons define the more limited volume region. The surfaces of the pole and the piston which face each other remain in substantial contact with each other at all times to provide a sufficiently large flux contact area.

In a further preferred embodiment, the hollowed cylindrical region of each of the poles receives a first ferromagnetic piston having a hollowed cylindrical region and a second ferromagnetic piston which is disposed in the hollowed region of the first piston. The first piston is in tight fitting relation to the surface of the pole defining the hollowed region and to the outer surface of the second piston facing the first piston. The first and second pistons are each coupled to the magnetic zoom operating assembly. The operating assembly can independently position each of the first and second pistons simultaneously and identically, at various distances extending into the gap region to provide for higher resolution scanning of a more limited region of a patient and adjustability of the magnet fields within the gap region when the higher resolution scanning is performed. The surfaces of the pole and the first piston which face each other, and the surface of the first piston and the second piston which face each other, remain in substantial contact with each other at all times to provide a sufficiently large flux contact area.

In a further embodiment, a multiple axis patient bed is located in the gap region so that the patient can be positioned at almost any desired angle in relation to the facing surfaces of the poles.

In another aspect of the invention, independent electromagnetic zoom means are positioned within the gap region by a mechanical support means and are separate and independent from the poles of a magnet assembly. The independent electromagnetic zoom means are arranged in the gap region to define a volume region of the patient through which an increased magnetic flux density is directed to provide for higher resolution scanning in that region.

BRIEF DESCRIPTION OF THE DRAWINGS

Other objects and advantages of the present invention will be apparent from the following detailed description of the presently preferred embodiments, which description should be considered in conjunction with the accompanying drawings in which:

FIG. 5A is a view of the vertical section of the top polar region of the magnet assembly as shown in FIG. 2B including an electromagnetic magnetic zoom means;

FIG. 5B is a view similar to that of FIG. 5A with the electromagnetic magnetic zoom means positioned further into the gap region;

DETAILED DESCRIPTION OF PREFERRED EMBODIMENTS

A magnet assembly in accordance with the present invention is configured to define a sufficiently large gap region which allows several medical personnel to have easy access to a patient positioned in the gap region while an anatomical region of the patient is scanned to obtain magnetic resonance images. The scanning can include scanning of a first volume region of the patient at a first scanning resolution and utilizing a magnetic zoom capability of the magnet assembly, which increases magnetic field strength in the gap region, to scan a volume region of the patient which is smaller than the first volume region, at a higher scanning resolution than the first scanning resolution.

Figure 1:
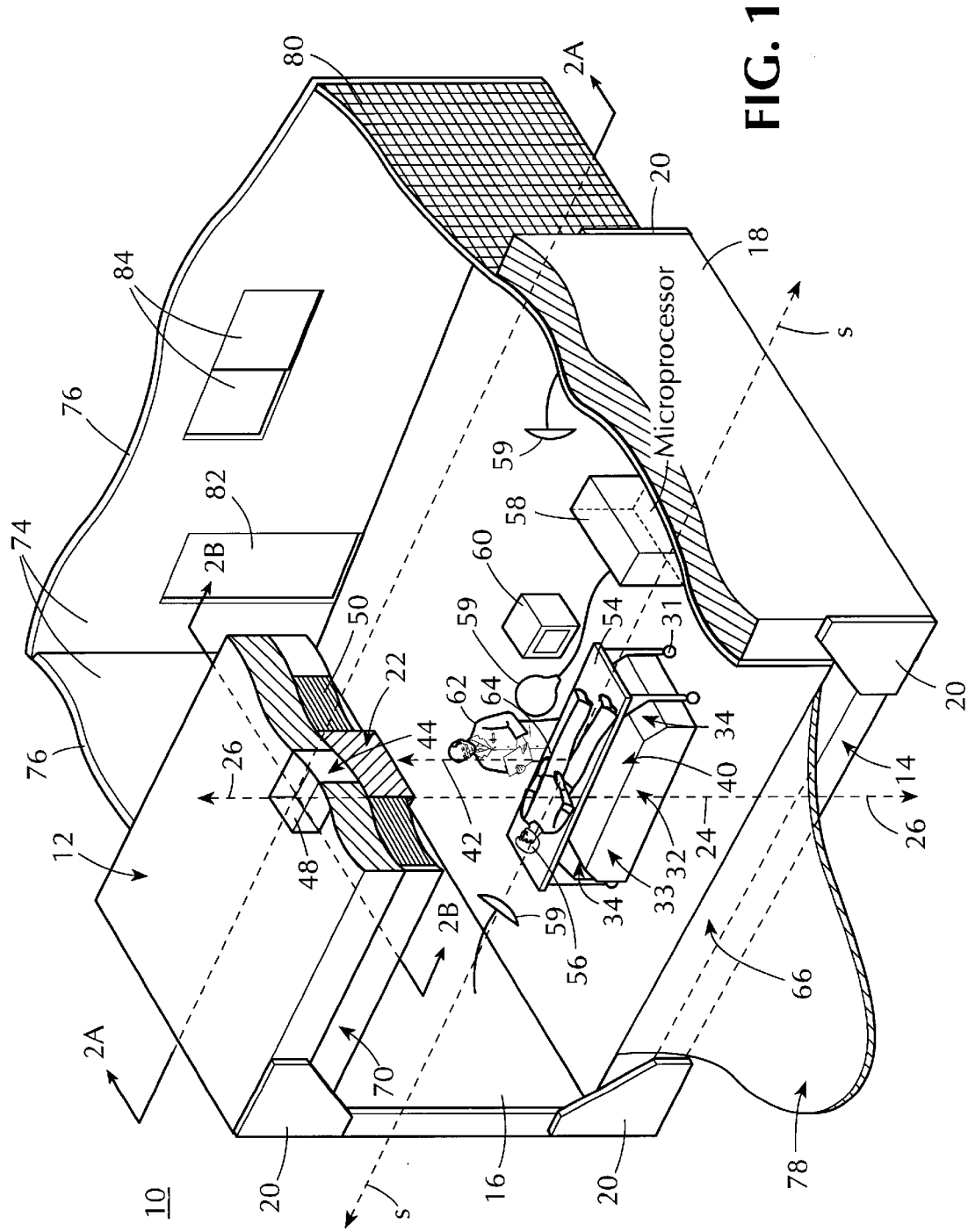
FIG. 1 is a plan view of an open entry magnetic resonance imaging magnet assembly configured in the form of a room according to the present invention.

FIG. 1 illustrates a perspective view of an exemplary magnetic resonance magnet assembly in a surgery room 10, which provides the capability of scanning various anatomical regions of interest of a patient in the room 10 at a plurality of scanning resolutions for generating magnetic resonance images, in accordance with the present invention. The magnet assembly, preferably, is a room size magnet and the room 10 is a magnetic resonance imaging operating room in which surgical procedures on a patient can be guided by magnetic resonance images. It is to be understood that a magnet assembly having the magnetic zoom capability of the present invention can have other suitable configurations which do not conform to the shape of a room.

Referring to FIG. 1, the magnet assembly includes a ferromagnetic upper pole support 12 and a ferromagnetic lower pole support 14. Ferromagnetic elements 16 and 18 are disposed between and at the ends of the pole supports 12 and 14. The ferromagnetic elements 16 and 18 support the upper pole support 12 above the lower pole support 14. The pole supports 12 and 14 and the ferromagnetic elements 16 and 18, thus, form four sides of a rectangular ferromagnetic yoke or frame, which is the flux return path.

Preferably, each of the ferromagnetic elements 16 and 18 is a steel slab comprised of multiple sections about nine feet tall, about ten feet wide and about one foot thick, and each of the pole supports 12 and 14 is a steel slab comprised of multiple sections about sixteen feet long, about ten feet wide and about one foot thick. Consequently, the upper pole support 12 lies approximately nine feet above the lower pole support 14 and the inwardly facing surfaces of the ferromagnetic elements 16 and 18 are spaced apart from one another by a distance of approximately fourteen feet.

Ferromagnetic gusset plates 20 are provided at the corners of the frame formed by the ferromagnetic elements 16 and 18 and the pole supports 12 and 14. The gusset plates 20 reinforce the frame.

Figure 2A:
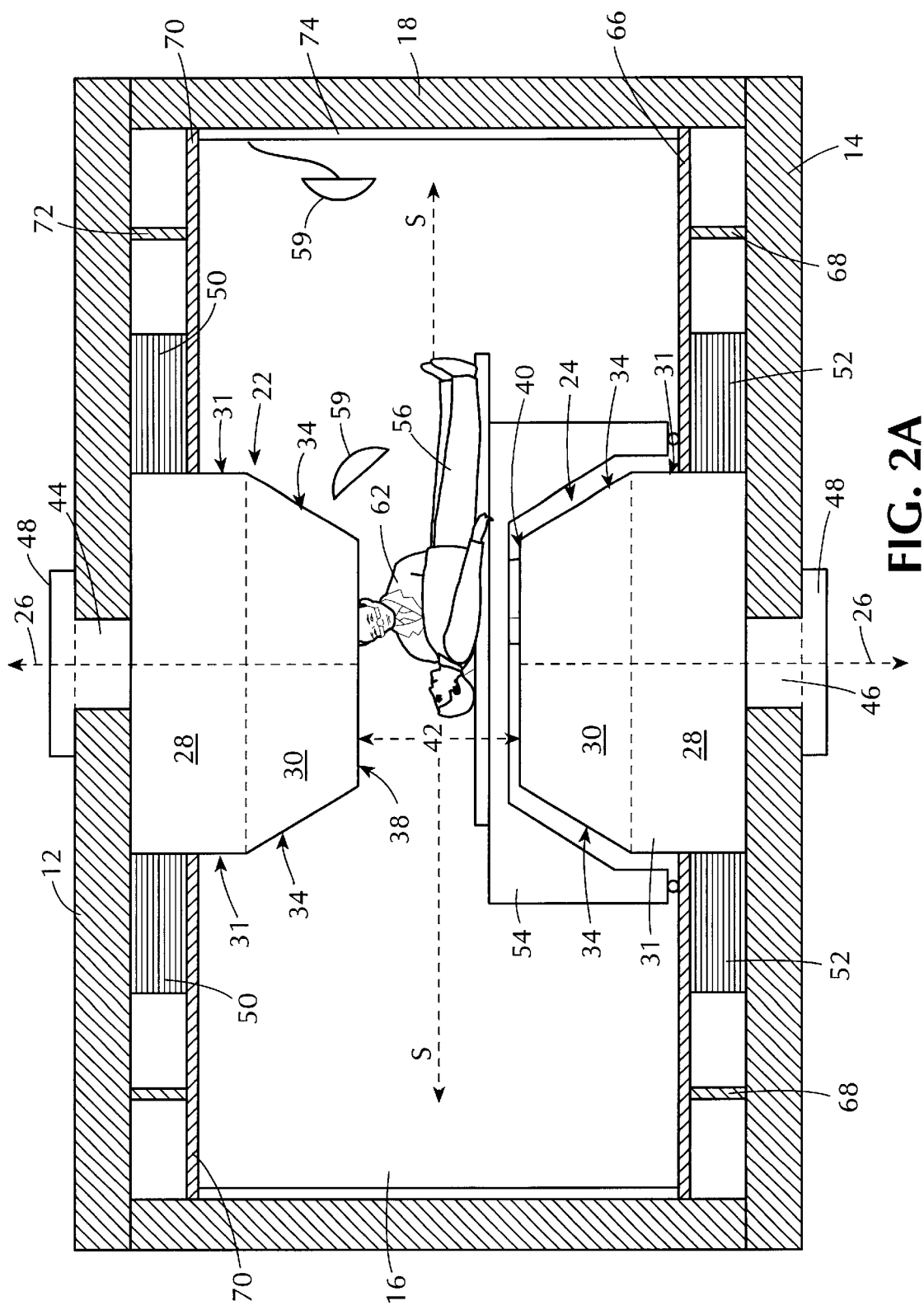
FIG. 2A is a vertical section of the magnet assembly in the room taken along the section line 2A—2A in FIG. 1.
Figure 2B:
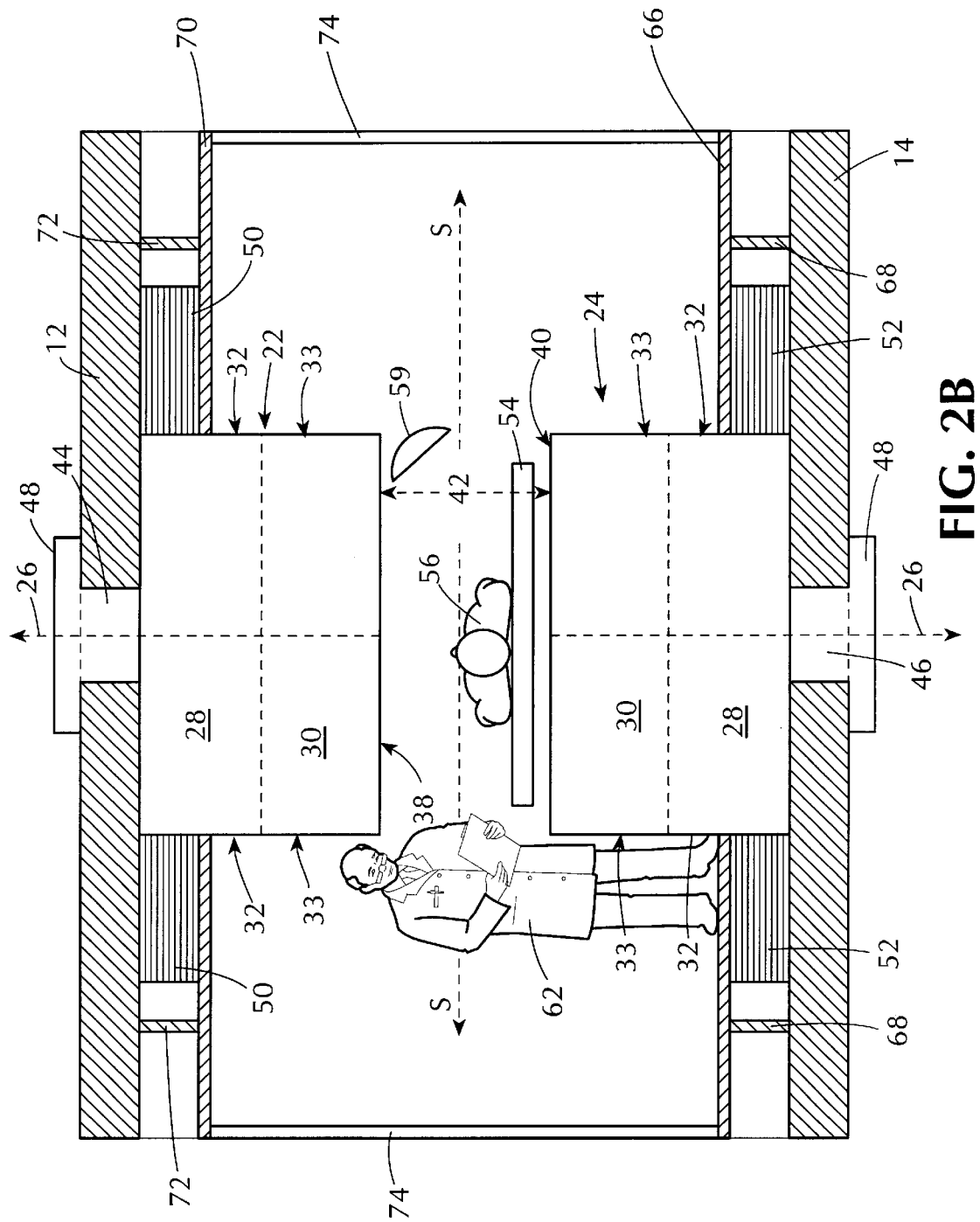
FIG. 2B is a vertical section of the magnet assembly in the room taken along the section line 2B—2B in FIG. 1.

Referring to FIG. 1 and also to FIGS. 2A and 2B, which show vertical cross-sections of FIG. 1 at the lines 2A—2A and 2B—2B, respectively, the magnet assembly further comprises an upper ferromagnetic pole 22 which projects downwardly from the upper pole support 12 and a lower ferromagnetic pole 24 which projects upwardly from the lower pole support 14. Both of the poles 22 and 24 and the pole supports 12 and 14 are aligned axially and are also symmetrical about an imaginary medial plane S which extends between the ferromagnetic elements 16 and 18. The poles 22 and 24 further define a polar axis 26 which extends between the pole supports 12 and 14 and about which the poles 22 and 24 and the pole supports 12 and 14 are symmetrical.

The poles 22 and 24 as illustrated in FIGS. 1, 2A and 2B are covered with a shroud (not shown) which substantially conforms to the geometrical structure of the outer facing surfaces of the poles 22 and 24. A more detailed description of the elements contained within or which can be associated with the top and bottom polar regions of the magnet assembly, in accordance with present invention, is provided below in connection with the description of FIGS. 3, 4A, 4B, 5A, 5B, 7 and 8. For clarity, the poles 22 and 24 are described at this point only in terms of their outer surfaces, which would be visible to a person in the room and to which the shroud would substantially conform when the magnet assembly is not utilized to obtain images using its magnetic zoom capability.

Referring again to FIGS. 1, 2A and 2B, the pole 22 includes a rectangular box shaped body portion 28 which is adjacent to the pole support 12. The body portion 28 includes shorter outer side walls 31 which are parallel to the ferromagnetic elements 16 and 18 and longer outer side walls 32 which are orthogonal to the ferromagnetic elements 16 and 18. The pole 22 further includes a trapezoidal box shaped body portion 30 which is integral with and extends downwards towards the opposing pole 24 from the body portion 28. The body portion 30 includes opposing longer walls 33 which are in the same plane as and extend from the side walls 32 of the body portion 28. The body portion 30 further includes opposing tapered outer side walls 34, each of which extends towards the polar axis 26 at the same angle in relation to the walls 31 of the body portion 28. The taper of the walls 34 accordingly decreases the lengthwise dimension of the outer walls 33 as the outer walls 33 extend away from the body portion 28. The outer walls 33 and 34 of the body portion 30 terminate in the same plane, which is parallel to the plane S, to form a rectangular pole tip facing surface 38. The facing surface 38, for example, can have a length of about 72 inches and a width of about 48 inches.

It is to be understood that the pole 22 can be constructed so that the facing surface 38 has another shape, such as circular or elliptical, and that the body portions 28 and 30 would be constructed accordingly to obtain such shape and also to maintain a pair of opposing walls which face the ferromagnetic elements 16 and 18 and each taper towards the polar axis 26. The tapered walls 34 of the pole 22 are suitably angled in relation to the polar axis 26 to maximize access to a patient 56 which is received in the gap region 42 between the poles 22 and 24 of the magnet assembly.

The pole 24 is identical in construction to the pole 22, with like structures having like reference numerals, and is not described in detail below. For clarity of reference, the facing surface on the pole 24 is designated below by reference numeral 40. The facing surfaces 38 and 40 of the poles 22 and 24, respectively, define a magnet gap region 42 therebetween which is sufficiently large to receive the body of a patient. For ease of reference, a gap distance is referred to below as the distance between the surfaces of the polar regions of the magnet assembly which extend furthest into the gap region 42 towards the plane S. Also, a pole separation distance is referred to below as the distance between facing surfaces of ferromagnetic structures, such as the surfaces 38 and 40, of the respective polar regions.

Apertures 44 and 46 are defined in the pole supports 12 and 14, respectively. A magnetic zoom operating assembly 48 is coupled to the surfaces of the pole supports 12 and 14 which oppose the gap region 42. The assembly 48 covers the apertures 44 and 46. The structure and operation of the operating assembly 48 in relation to the apertures 44 and 46 and a mechanical flux generation increasing means, or so-called mechanical magnetic zoom means, which can be coupled to each pole of the magnet assembly to provide magnetic zoom capability, is discussed in greater detail below in connection with FIGS. 3, 4A and 4B.

An upper electromagnetic coil 50 encircles the pole 22 at the juncture of the body portion 28 with the upper pole support 12. A corresponding lower electromagnetic coil 52 encircles the pole 24 at the juncture of its body portion 28 with the lower pole support 14. The coils 50 and 52, alternatively, can be resistive or superconductive.

The gap region 42 further includes a patient support or bed 54 of which at least a portion is positioned between the surfaces 38 and 40 and on which the patient 56 is positioned lying down. One or more radio frequency (RF) transmitting and receiving antennae 59 are also included in the gap region 42, preferably in proximity to a region of interest of the patient 56 which will be scanned for obtaining magnetic resonance images.

The poles 22 and 24, the coils 50 and 52, the antennae 59, the operating assembly 48 and electronic components which are coupled to the poles 22 and 24, such as magnetic field gradient coils, are linked to a conventional magnetic resonance imaging system 58. The system 58 includes elements such as a DC power supply for energizing the coils 50 and 52, a gradient coil power supply for energizing the magnetic field gradient coils and RF transmitters and receivers which are linked to the antennae 59. The system 58 further includes magnetic resonance imaging hardware and software, such as a microprocessor linked to a memory, that transforms the magnetic resonance signals detected from a region of interest which is scanned into magnetic resonance images. Further, an image display or image data download device, such as a video monitor 60, is connected to the microcontroller in the system 58 and suitably mounted inside the interior of the room 10 so that a physician 62 or another attendant (not shown) who may be involved in performing medical procedures, such as surgery, on the patient 56 and is standing at least partially in the gap region 42 near the patient 56, can observe the magnetic resonance images of the patient 56 in real time, while performing the medical procedures.

Control apparatus 64, such as a keyboard, joystick, mouse or speech recognition control module, is also linked to the system 58, such as by hardwire or infrared radiation link, and disposed as near to the patient 56 as suitable. The control apparatus 64 allows the physician 62, from within the room 10, to control the type of scanning performed on the patient 56 and, in particular, to utilize the magnetic zoom capability of the magnet assembly to obtain higher resolution scanning of a smaller, more defined volume region of the patient 56 than the region scanned when the magnetic zoom capability is not utilized. In addition, the monitor 60 can include touch-sensitive elements that similarly allow one to control the type of scanning that the magnet assembly performs. Such computer control elements are well known in the magnetic resonance imaging art and are not described further herein.

The room 10 further includes a raised floor 66 which is supported above the lower pole support 14 by a set of braces 68. The floor 66 extends over the top of the coils 52 and around the body portion 28 of the pole 24. Ceiling suspension support members 72 suspend a ceiling 70 beneath the upper pole support 12. Wall coverings 74 cover the inwardly facing surfaces of the ferromagnetic elements 16 and 18 and other walls 76 which define the room 10. The floor 66, the ceiling 70 and the wall coverings 74 preferably are formed from non-magnetic materials such as polymeric materials, wood fibers, paper and cementitious materials such as concrete, plaster, plasterboard and the like. The exposed, inwardly facing surfaces of the floor 66, the walls 74 and the ceiling 70 desirably are formed from standard architectural materials and have the appearance of ordinary room walls. The floor 66 may be continuous with a floor 78 of a building in which the room 10 is located. The wall coverings 74 may be continuous with the walls 76 of the building. Likewise, the ceiling 70 may be continuous with a ceiling (not shown) which is part of the building.

Thus, the space within the magnet assembly and enclosed by the floor 66, the ceiling 70 and the wall coverings 74 constitutes part of an ordinary room, i.e., the room 10. The frame of the magnet assembly, which is defined by the pole supports 12 and 14 and the ferromagnetic elements 16 and 18, is disposed outside of the room 10. Also, the coils 50 and 52 are disposed outside of the room 10. The patient 56 or another person inside of the room 10 sees the poles 22 and 24 protruding into the room 10 from the ceiling 70 and the floor 66, but otherwise considers the room 10 to be an ordinary room. The shrouds which cover and conceal the poles 22 and 24 desirably are formed from non-magnetic materials, such as polymeric materials. Thus, a patient perceives the magnetic resonance imaging magnet assembly as entirely open and non-claustrophobic.

Each of the ferromagnetic elements 16 and 18 is disposed about seven feet from the polar axis 26 as measured from the polar axis 26 to any ferromagnetic element in a direction perpendicular to the polar axis 26. The disposition of the ferromagnetic elements 16 and 18 at a substantial distance from the polar axis 26 allows an adult human patient to be positioned on the support 54, such as a five-axis bed, in a generally horizontal position with her body extending along the medial plane S. The bed 54, preferably, can be translated, as seen from the perspective of FIG. 1, in any direction in a plane orthogonal to the flux elements 16 and 18 and also orthogonal to the facing surfaces 38 and 40. The bed 54 also can be rotated up to 360° in either direction in a plane parallel to the plane S and clockwise or counterclockwise about an axis of rotation defined by a line extending between and orthogonal to the ferromagnetic elements 16 and 18. Thus, a patient can be disposed in any radial direction with any part of her body in relation to the surfaces 38 and 40, and essentially any part of a normal human patient can be imaged.

Moreover, the space around the poles 22 and 24, as enabled by the tapering of the walls 34, provides an unobstructed working space sufficient to accommodate the physician 62 or one or more persons, such as other physicians, nurses or attendants. This space is unobstructed by any portion of the frame of the magnet assembly and extends entirely around the poles 22 and 24 and the polar axis 26. Thus, apart from any obstructions that the patient support 54 or the patient 56 herself can create, the attendants can have access to the patient 56 from all directions. This working space extends to the region of the magnet assembly between the coils 50 and 52, which includes the portion of the working space disposed above the lower coil 52 and below the upper coil 50. The tapered walls 34 of each of the poles 22 and 24 also advantageously provide additional working space in the vicinity of the patient 56. As such, the magnet assembly affords a degree of access to the patient 56 that is essentially the same as the degree of access provided in an ordinary operating room, with only a slight obstruction caused by the poles 22 and 24 themselves.

The room 10 also, preferably, is surrounded with a continuous or substantially continuous electrically conductive shield, commonly referred to as a Faraday shield, which shields the working space and the gap region 42 from radio frequency interference to prevent interference with the magnet resonance imaging procedure. The pole supports 12 and 14 and the ferromagnetic elements 16 and 18 of the magnet frame are electrically conductive and thus, individually, form portions of the Faraday shield. The floor 66, the walls 76 and the ceiling 70 of the room 10 are provided with conductive elements, such as conductive mesh 80, as shown in FIG. 1. The conductive mesh 80 may be electrically connected to the frame of the magnet assembly by a wire or bonding strap (not shown), which connects the mesh 80 to the frame.

A door 82 and a window 84 of the room 10, each of which penetrates one of the walls 76, are also provided with conductive coverings, such as a mesh in the door 82 and a conductive film on the window 84. These conductive coverings desirably are also connected to the remainder of the Faraday shield.

The equipment disposed inside of the room 10, and hence inside of the Faraday shield, are suitably designed for low radio frequency (RF) emission. For example, the video monitor 60 may be provided with an enclosure having a conductive shield which is grounded to the frame. Also, fixtures such as overhead lights (not shown) that are secured to the ceiling 70 may be provided with similar shielding. Equipment for performing medical procedures on a patient or any other type of conventional medical equipment also may be disposed inside the room, within the interior of the magnet frame.

In ordinary or normal mode operation of the magnet assembly, in other words, when the magnetic zoom capability of the magnet assembly is not utilized in accordance with the present invention, the pole supports 12 and 14, the ferromagnetic elements 16 and 18 and the poles 22 and 24 are arranged to provide a path of low magnetic reluctance for the flux that the coils 50 and 52 generate. The flux is relatively concentrated in the poles 22 and 24 and in regions of the upper and lower pole supports 12 and 14 adjacent to the polar axis 26. Thus, the magnetic field achievable in the gap region 42 at a volume region of the patient 56 defined by the area of the surfaces 38 and 40 facing the plane S, in the normal mode of the magnet assembly, is limited by magnetic saturation of the ferromagnetic material in the magnet assembly and the pole separation distance. In the normal mode, the pole separation distance is the distance between the surfaces 38 and 40 and is, preferably, equal to about 36 inches.

In accordance with present invention, means for increasing flux generation in the gap region 42 is coupled to each of the poles 22 and 24 to provide a high resolution scanning mode of operation of the magnet assembly, or a so-called magnetic zoom mode, that allows for higher resolution scanning of a smaller region of the patient, in comparison to the region scanned and the scanning resolution attainable under the normal mode of operation of the magnet assembly.

Figure 3:
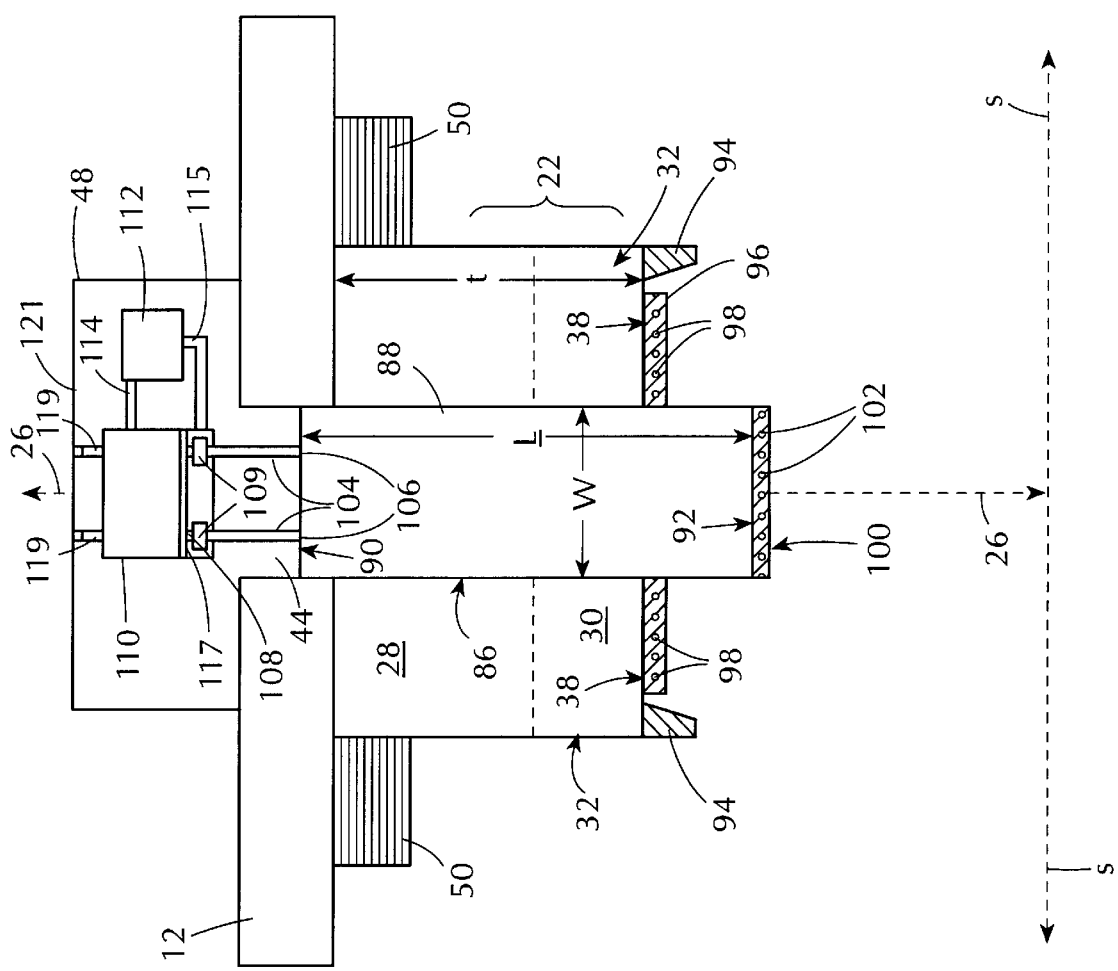
FIG. 3 is a view of the vertical section of the top polar region of the magnet assembly as shown in FIG. 2B including a mechanical magnetic zoom means in the form of a ferromagnetic piston.

In one aspect of the invention, a mechanical means for increasing flux generation in the gap region 42 is coupled to each of the poles 22 and 24 of the magnet assembly. FIG. 3 illustrates one embodiment of the magnet assembly including a mechanical magnetic zoom means comprising a ferromagnetic piston 88, which can be extended into the gap region 42 from the poles 22 and 24 in the magnetic zoom mode. FIG. 3 shows the piston 88 in the magnet assembly from the perspective of a vertical cross-section through the top polar region of the magnet assembly, which includes the top plate support 12, the top pole 22 and the electromagnetic coil 50, as shown in FIG. 2B. It is noted that the bottom polar region, which includes the plate support 14, the bottom pole 24 and the electromagnetic coil 52, would have a structure that is identical to the top polar region and that the top and bottom polar regions are symmetrically aligned about the polar axis 26 and symmetrical about the plane S. Therefore, for conciseness, only the top polar region is described in detail below.

Referring to FIG. 3, the body portions 28 and 30 of the pole 22 are hollowed axially symmetrically about the polar axis 26 to a constant diameter W to define a hollow cylindrical volume region 86 within the pole 22. The hollowed region 86 extends lengthwise through the entire pole 22, from the surface 38 to the surface of the pole support 12 adjacent to the body portion 28, the distance between the former and latter being equal to t. The aperture 44 in the pole support 12 also has been hollowed about the polar axis 26 to the same constant diameter W to define a hollow cylindrical volume region extending through the entire thickness of the support 12. The inner surfaces of the pole support 12 which define the aperture 44 and the inner surfaces of the pole 22 which define the region 86 are, therefore, aligned with each other.

The hollowed region 86 contains the piston 88. The piston 88 is in the shape of a cylinder bounded lengthwise by an end surface 90 which faces the assembly 48 and an end surface 92 which faces the gap region 42. The outer surface of the piston 88 has a constant diameter equal or substantially equal to W and the distance between the end surfaces 90 and 92 is equal to L. Thus, the outer surface of the piston 88 has a constant diameter which is substantially equal to the diameter W of the region 86 and the aperture 44.

An annular ferromagnetic structure called a shim bar 94 is disposed on the surface 38. The shim bar 94 is mounted at the outer perimeter of the surface 38 and has a beveled inner surface which faces the pole center. The shim bar 94 is a conventional component positioned around the periphery of the pole 22 to compensate for normal magnetic field fall off at the periphery, thereby increasing the volume of uniform and homogenous magnetic field in the gap region 42.

An insulative support 96 is mounted on the portion of the surface 38 which the shim bar 94 circumscribes. The support 96 is of the same thickness as the shim bar 94 and contains magnetic field gradient coils 98 which can conduct electrical current and develop magnetic field gradients to spatially encode the region of interest being scanned according to well known techniques that are not a part of this invention.

An insulative support 100 is mounted on the surface 92 of the piston 88. The support 100 also contains magnetic field gradient coils 102 which can conduct electrical current and develop magnetic field gradients. The support 100 with the coils 102 has the same thickness as the support 96, and operates in the same manner as the support 96 with the coils 98. The support 100 and 96 are each electrically coupled (not shown) to the system 58 and are independently controllable by the system 58.

Ends 106 of two connecting rods 104 are each rigidly secured to the end surface 90 of the piston 88. The connecting rods 104 extend from the end surface 90, through the aperture 44 and are connected at opposite ends 108 to a means for piston positioning 110 which is contained in the magnetic zoom operating assembly 48.

Encircling the rods 104 adjacent to the ends 108 are stop means or cylinders 109 which are rigidly connected to the rods 104. The stop cylinders 109 have a diameter which is wider than the apertures in the piston positioning means 110 through which the rods 104 pass. Reinforced supports 119 rigidly mount the piston positioning means 110 to the surface of the assembly 48 which opposes the plane S.

The piston positioning means 110 is compartmentalized into two chambers by the piston head 117. The assembly 48 further includes a controllable piston actuating means or pump 112 which is coupled to the two chambers of the piston positioning means 110 via the lines 114 and 115, respectively. The piston head 117 and all penetrations of the piston positioning means 110 and the pump 112, such as the lines 114 and 115, have air tight seals.

In a preferred embodiment, the combination of the piston positioning means 110, the pump 112 and the lines 114 and 115 constitutes a conventional hydraulic positioning device that is controllable by control signals that a microcontroller, such as a microcontroller in the system 58, transmits to the pump 112. The pump 112 can control fluid flow over the lines 114 and 115 to maintain the rods 104 at, or to move the rods 104 to, a predetermined position in relation to the plane S. The positioning means 110 is a conventional hydraulic support which can maintain the rods 104 stationary or move them towards or away from to the plane S, based on the fluid that the pump 112 supplies to or receives from either of the chambers of the positioning means 110.

Based on the control signals transmitted to the pump 112, the pump 112 can operate to receive a predetermined amount of fluid from the positioning means 110 over the line 114 and supply a predetermined amount of fluid to the positioning means 110 over the line 115 so as to retract the connecting rods 104 into the positioning means 110 a predetermined length, thereby causing the piston 88 to be moved the predetermined length away from the plane S. On the other hand, the actuating means 112 can operate to supply a predetermined amount of fluid under pressure to the positioning means 110 over the line 114 and receive a predetermined amount of fluid from the positioning means 110 over the line 115 to force the connecting rods 104 away from the positioning means 110 a predetermined length, thereby causing the piston 88 to be moved the predetermined length towards the plane S. When the pump 112 does not supply fluid to or receive fluid from the positioning means 110, the rods 104 and thus the pistons 88, are maintained in place at the same distance away from the plane S.

The piston positioning means 110 is of a sufficient size and is suitably positioned within the assembly 48 and the connecting rods 104 are of sufficient length to permit the piston positioning means 110 to controllably retain the connecting rods 104 when the connecting rods 104 are positioned such that: (i) the end surface 38 is in the same plane as the end surface 92 of the piston 88; and (ii) the piston 88 is extended into the gap region 42 to a maximum extent, which would constitute a maximum level of magnetic zoom for the magnet assembly. When at least a portion of the end surfaces 92 of the pistons 88 are extended into the gap region 42, the pole separation distance is the distance between the end surfaces 92 of the pistons 88 and the gap distance is the distance between the facing surfaces of the supports 100 which are mounted on the respective surfaces 92. The gap distance at the maximum level of magnetic zoom is about 12 inches.

It is to be understood that the assembly 48 can contain other suitable mechanical devices for controllably positioning the connecting rods 104 at different positions in the gap region 42 in relation to the plane S in accordance with present invention, such as, for example, a pneumatic piston positioning system.

The dimensions of the piston 88 and the hollowed region 86 provide that the outer surface of the piston 88 is, preferably, in substantial contact with the surface of the pole 22 which defines the region 86. Also, when at least a portion of the piston 88 is within the aperture 44, the outer surface of the piston 88 which is within the aperture 44 is preferably in substantial contact with the surface of the pole support 12 which defines the region 44. The diameter W of the piston 88, the cylindrical hollow region 86 and the aperture 44 is suitably set to define a smaller size volume region of the patient 54 which is to undergo higher resolution scanning in the magnetic zoom mode. The diameter W, preferably, is about 24 inches and can be larger or smaller, as desired.

It is to be understood that the piston 88 may assume other shapes, such as an elliptical or rectangular body shape, and that the hollowed regions in the pole and the aperture in the pole support would have a corresponding structure which would ensure close contact between the surfaces of the piston which face the pole and the pole support and the surfaces of the pole and the pole support which define the hollowed region and the aperture, respectively.

In a preferred embodiment, the length L of the piston 88 is sufficient to ensure that when at least a portion of the piston 88 is positioned within the gap region 42, the outer surface of the piston 88 contacts a large area of the surface of the pole 22 which defines the region 86. The length of the piston 88, preferably, provides that when the piston 88 vertically protrudes into the gap region 42 to the maximum extent, thereby providing the maximum magnetic zoom, a large flux contact area between the facing surfaces of the piston 88 and the pole 22 equal to ΠW×t is maintained. This large flux contact area maximizes the amount of transfer of the flux that the coil 50 generates and is directed into the portion of the gap region 42 which is defined between the end surfaces 92 of the respective pistons 88. The quality of the ferromagnetic material used in the pole 22 and the amount of field strength required for achieving a predetermined level of scanning resolution in the magnetic zoom mode determines the amount of flux contact that would be required.

The operation of the magnet assembly of FIGS. 1, 2A and 2B including the embodiment of the polar region illustrated in FIG. 3 at both the top and bottom polar regions is, for conciseness, described below for the most part with respect to the movement of the piston 88 in the pole 22 towards and away from the medial plane S. It is to be understood that the piston 88 in the pole 24 is identical in structure and operation to the piston 88 in the pole 22, and that each of the pistons 88 would move simultaneously and identically towards and away from the medial plane S during magnetic zoom mode operation of the magnet assembly.

Referring to FIGS. 1 and 3, the patient 56 is positioned in the gap region 42 on the support 54 with the center of an anatomical region of interest intersected by the polar axis 26. In the normal mode of operation of the magnet assembly, which is ordinarily initially performed, the piston 88 is positioned completely within the pole 22 and the end surface 92 is in the same plane as the surface 38. The coils 98 and 102 in the supports 96 and 100 are both energized for scanning. The gap distance in the normal mode is the distance between the facing surfaces of the supports 100 and 96, which are in the same plane, and provides substantially unimpeded access to the patient 56.

Magnetic resonance images in the normal operation mode are obtained by scanning a relatively large volume region of the patient 56. The large volume region is defined based on the combined surface area of the end surfaces 38 and 92 which face the plane S. The scanning resolution is defined in relation to the entire surface area of the end surfaces 38 and 92 and the pole separation distance, which is the distance between the end surfaces 38 and 92 of the opposing poles 22 and 24. The magnetic field strength of the magnet assembly generated by the coils 50 and 52 also determines the resolution of the scanning and, for simplicity, it is assumed to be constant in both the normal and the magnetic zoom modes of operation.

The operation of the magnet assembly in the normal mode may be performed as the patient 56 undergoes surgery in a region near or within the anatomical region being scanned. As the need arises, the physician 62 can, via the controller 64, command the magnet assembly to operate in the magnetic zoom mode.

In the magnetic zoom mode, a higher level of scanning resolution within a smaller volume region of the patient 56, which is defined by the surface area of the surface 92 which faces the patient 56, is obtained. Upon initially receiving a command to operate in the magnetic zoom mode rather than in the normal mode, the controller in the system 58 would transmit control signals to the operating assembly 48, particularly to the pump 112, to cause the piston positioning means 110 to move the piston 88 a predetermined distance towards the plane S into the gap region 42. The positioning means 110 forces the connecting rods 104 and, in turn, the piston 88 into the gap region 42 at smooth and non-abrupt increments based on the amount of fluid that the pump 112 supplies to one of the chambers of the positioning means 110 over the line 114 and the amount of fluid that the pump 112 receives from the other chamber of the positioning means 110 over the line 115. Similarly, the positioning means 110 provides that the piston 88 can be retracted from the gap region 42 in smooth and non-abrupt increments based on the fluid received therefrom and supplied thereto by the pump 112 over the lines 114 and 115, respectively. Also, in the magnetic zoom mode, the system 58 energizes only the coils 102 in the piston 88.

The surgeon 62 can command the system 58 to locate the piston 88 to various preset positions within the gap region 42 to achieve respective higher levels of scanning resolution, as desired. For example, if the surgeon 62 desires to view images of the same smaller region of the patient 56 at various preset levels of increased scanning resolution, the surgeon 62 can command the system 58, via the controller 64, to locate the piston 88 further into the gap region 42. At a higher scanning resolution level, the pole separation distance is the distance between the surfaces 92 of the opposing pistons 88 in the poles 22 and 24 with the pistons 88 within the gap region 42. The movement of the pistons 88 into the gap region 42 also decreases the gap distance. At the maximum magnetic zoom, the pole separation distance is about 12 inches.

If the positioning means 110 malfunctions, such that the positioning means 110 cannot controllably retain the rods 104, the stop cylinders 109 on the rods 104 would prevent the rods, and hence the piston 88, from moving closer than a predetermined distance away from the plane S. The stop cylinders 109 prevent the rods 104 from emerging from the piston positioning means 110 beyond a predetermined extent at the apertures where the rods 104 are received. The reinforced supports 119 in combination with the assembly 48 can support the weight of the piston 88 and the piston positioning means 110. Thus, the patient 56 is protected from injury which would be caused if the piston 88 of the pole 22 accidentally fell onto the patient 56.

The movement of the pistons 88 of the poles 22 and 24 into the gap region 42 causes magnetic flux to be applied through a volume region defined between the surfaces 92 of the opposing pistons 88. The smaller pole separation distance in the magnetic zoom made, in comparison to the normal mode, provides for an increase in the magnetic field strength at the region of interest positioned in the gap region 42 between the surfaces 92. Although at least a portion of the piston 88 protrudes from the pole 22 into the gap region 42 in the magnetic zoom mode, the length of the piston 88 is sufficient to maintain a sufficiently large area of contact with the pole 22. This large flux contact ensures the flux from the coil 50 is efficiently transferred into the piston 88 and through the smaller pole separation distance of the gap region 42 in the magnetic zoom mode. Further, the smaller gap distance in the maximum magnetic zoom level, in comparison to that of the normal mode, does not substantially impede access to the patient 56 by others, such as to interfere with surgery that is being performed on the patient 56.

The combination of a high level of flux transference, provided by the large flux contact area between the piston 88 and the pole 22, and the movement of the piston 88 further into the gap region 42 to decrease the pole separation distance and the gap distance of the magnet assembly, advantageously operates to produce higher magnetic fields through the smaller region of interest in the form of an increased flux density. The increased flux density in the smaller region of the patient 56 provides for higher resolution scanning within that smaller region, because the detected radiation signals at the antennae 59 for the smaller scanned region would have a higher radio frequency and a higher signal-to-noise ratio.

In one alternative embodiment, a series of different transmitting and receiving coils or antennae, each of which is tuned for the frequency of the corresponding preset piston location, provides the frequency appropriate to the preset position of the pistons 88. In another alternative embodiment, a single receiving and transmitting coil or antenna can be tuned to multiple frequencies.

The radiation signals that are detected when the magnet assembly is operated in the magnetic zoom mode are processed to obtain magnetic resonance images in a manner similar to that performed to obtain magnetic resonance images when the magnet assembly is not operated in the magnetic zoom mode.

In one embodiment, when the microcontroller in the system 58 receives a command for moving the pistons 88, the microcontroller automatically de-energizes all of the coils, including the coils 50, 98 and 102, and then moves the pistons 88 to the next desired position with respect to the plane S, and then re-energizes all of the coils. Alternatively, the pistons 88 can be moved in a full field condition, while all of the coils are energized.

In one preferred embodiment of the magnetic zoom mode, the radio frequency coils 59 can be disposed in greater proximity to the region of interest being scanned to obtain further improvements in the scanning resolution.

In another preferred embodiment, a plurality of hollowed regions and apertures can be defined in the poles and the pole supports to receive a plurality of pistons, respectively, in a magnet assembly, in accordance with the present invention, to provide that a plurality of smaller volume regions of a patient can be scanned individually, or in combination, at higher scanning resolution levels in the magnetic zoom mode.

Figure 4A:
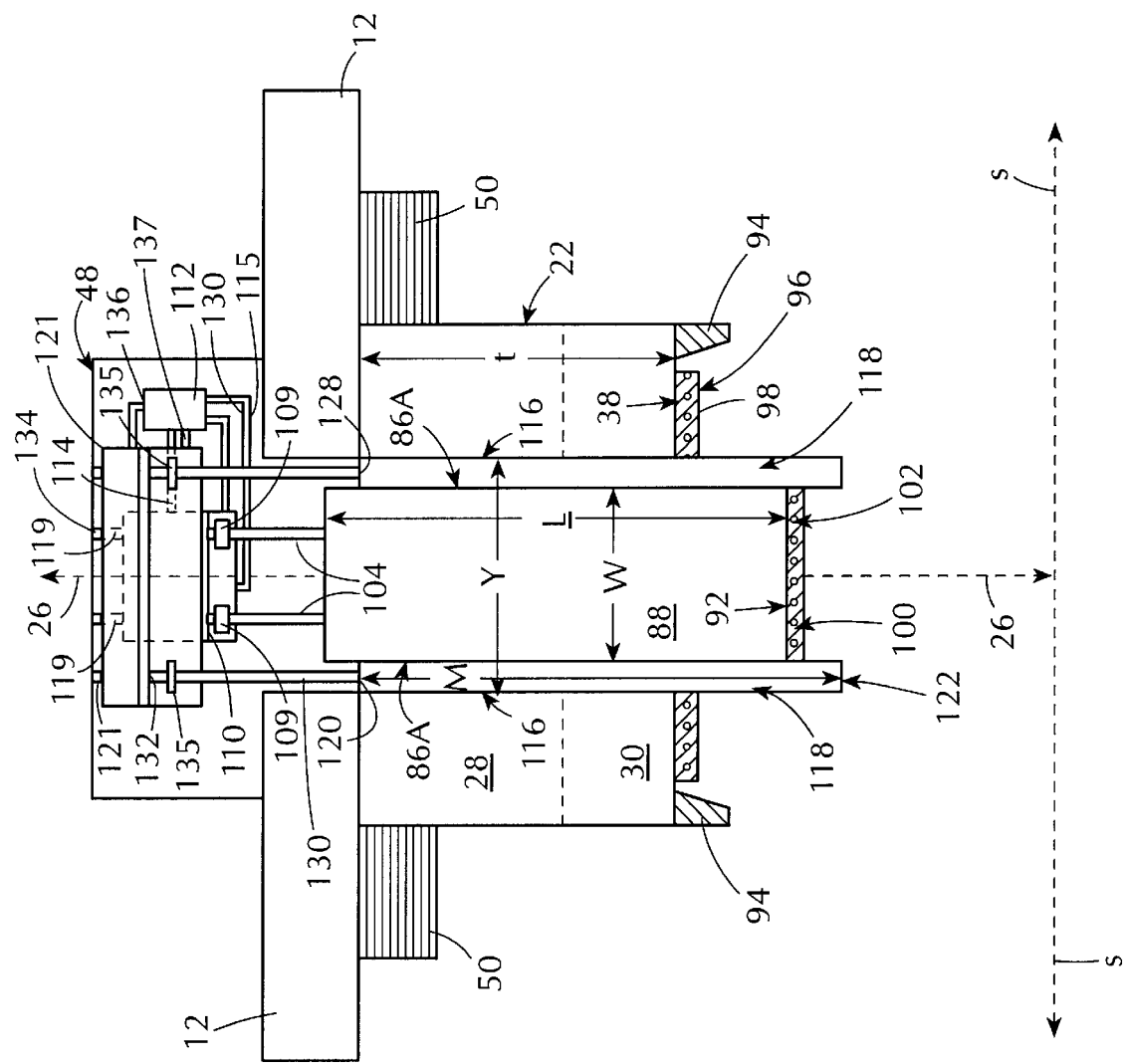
FIG. 4A is a view of the vertical section of an alternative embodiment of the top polar region of the magnet assembly as shown in FIG. 2B including a mechanical magnetic zoom means in the form of two concentric ferromagnetic pistons.

FIG. 4A illustrates an alternative embodiment of the top polar region of the magnet assembly shown in FIG. 3 including another ferromagnetic piston 118 which provides for adjusting the magnetic fields generated when the magnet assembly is operated in the magnetic zoom mode. Like reference numerals are used to refer to elements having similar and, preferably, identical structural and functional characteristics as those described above in connection with FIG. 3.

Referring to FIG. 4A, the body portions 28 and 30 of the pole 22 are hollowed axially symmetrically about the polar axis 26 to a constant diameter Y to define a hollow cylindrical volume region 116 within the pole 22. The hollowed region 116 extends from the surface 28 to the surface of the pole support 12 adjacent to the body portion 28 and has a length equal to t. The aperture 44 defined in the pole support 12 also has been hollowed about the polar axis 26 to the same constant diameter Y The inner surface of the pole support 12 which defines the aperture 44 and the inner surface of the pole 22 which defines the region 116 are, thus, aligned with each other.

The hollowed region 116 contains a piston 118 which is comprised of ferromagnetic material. The piston 118 is in the shape of a hollowed cylinder bounded lengthwise by an end surface 120 which faces the assembly 48 and an end surface 122 which faces the gap region 42. The outer surface of the piston 118, which extends between the end surfaces 90 and 92, has a constant diameter equal or substantially equal to Y. The inner surface of the piston 118, which extends between the end surfaces 120 and 122 and defines a hollowed region 86A within the piston 118, has a constant diameter equal or substantially equal to W. The distance between the end surfaces 120 and 122 is equal to M. Thus, the outer surface of the piston 118 has a constant diameter which is substantially equal to the diameter Y of the region 116 and the aperture 44.

Ends 128 of two connecting rods 130 are each rigidly secured to the end surface 120 of the piston 118. The connecting rods 130 extend from the end surface 120, through the aperture 44 and are connected at opposite ends 132 to a second piston positioning means 134 which is contained in the operating assembly 48. The rods 130 further include stop cylinders 135 at the ends 132 which are similar in structure and operation as the stop cylinders 109. Also, the piston positioning means 134 is rigidly connected to the assembly 48 by reinforced supports 121 which are similar in structure and operation to the supports 119. The pump 112 is coupled to the piston positioning means 134 over the lines 136 and 137. The piston positioning means 134 is similar in structure and operation to the piston positioning means 110.

The combination of the piston positioning means 134, the actuating means 112 and the lines 136 and 137, like the combination of the piston positioning means 110, the actuating means 112 and the line 114, constitutes a conventional hydraulic positioning device that is controllable by signals that a microcontroller, such as the microcontroller in the system 58, supplies to the positioning means 134. Based on the control signals supplied to the pump 112, the pump 112 supplies a predetermined amount of fluid under pressure to and receives a predetermined amount of fluid from the piston positioning means 134 over the lines 136 and 137 to hold the rods 130 stationary or to move the rods 130 towards or away from the medial plane S. Thus, the assembly 48 provides for independent control of the positioning of the piston 118 in relation to the plane S.

The hollowed region 86A of the piston 118 contains the piston 88 therein. Therefore, the pole 22 includes a pair of axially symmetric concentric pistons. The outer surface of the piston 118 is, preferably, substantially in contact with the surface of the pole 22 which defines the region 116. Also, the outer surface of the piston 88 is, preferably, substantially in contact with the surface of the piston 88 which defines the region 86. When at least a portion of the piston 118 is within the aperture 44, the outer surface of the piston 118 which is within the aperture 44 is substantially in contact with the adjacent facing surface of the pole 22 which defines the region 44. Consequently, the facing surfaces of the pistons 88 and 118, the pole 22 and the pole support 12 provide a low reluctance path for flux.

The diameter W of the piston 88 and the width of the end surfaces 120 and 122 of the piston 118, which is defined as the difference between Y and W are suitably set to define the size of the smaller volume region of the patient 56 which is to undergo higher resolution scanning. The values for Y and W are selected to provide for suitable adjustment of the uniformity of the magnetic field that passes through the gap region 42 between the facing surfaces of the support 100 mounted on the surfaces 92 at the higher resolution scanning levels attainable in the magnetic zoom mode, The diameters W and Y, preferably, are about 24 and 30 inches, respectively.

It is to be understood that the piston 118 and the hollowed region 86A which it defines may assume other shapes, such as an elliptical or rectangular box. The hollowed regions in the poles and the apertures in the pole supports would have a corresponding structure to receive the pistons 88 and 118 which also would have corresponding structures. This correspondence in structure would maintain as close contact between the facing wall surfaces of the pistons and the poles as possible.

The piston positioning means 134 is of a sufficient size and is suitably positioned within the assembly 48 and the connecting rods 130 are of sufficient length for the piston positioning means 134 to controllably retain the connecting rods 134 when the connecting rods 134 are positioned such that: (i) the face surface 122 is aligned in the same plane as the surface 38 of the pole 22; and (ii) the piston 118 is extended into the gap region 42 to a necessary extent in relation to the extent that the piston 88 is extended the gap region 42 to provide suitable adjustment of the magnetic field in the magnetic zoom mode of operation for the magnet assembly.

In operation of a magnet assembly of the present invention including top and bottom polar regions as shown in FIG. 4A in the magnetic zoom mode, the piston positioning means 134 independently controls the position of the piston 118 in relation to the plane S to adjust the magnetic field that is applied through the smaller volume region of the patient in accordance with the level of magnetic zoom applied. The piston 118 acts as a tunable shim bar for the piston 88. The amount that the piston 118 is moved towards or away from the plane S in relation to movement of the piston 88 towards or away from the plane S to adjust the magnetic field strength is determined automatically based on values stored in the memory of the system 58, such as in a ROM lookup table. These values are calculated to account for the different field strengths that the coils of a magnet assembly generate and the increased field strength that is obtained when the piston 88 is moved a predetermined distance into the gap region 42.

Figure 4B:
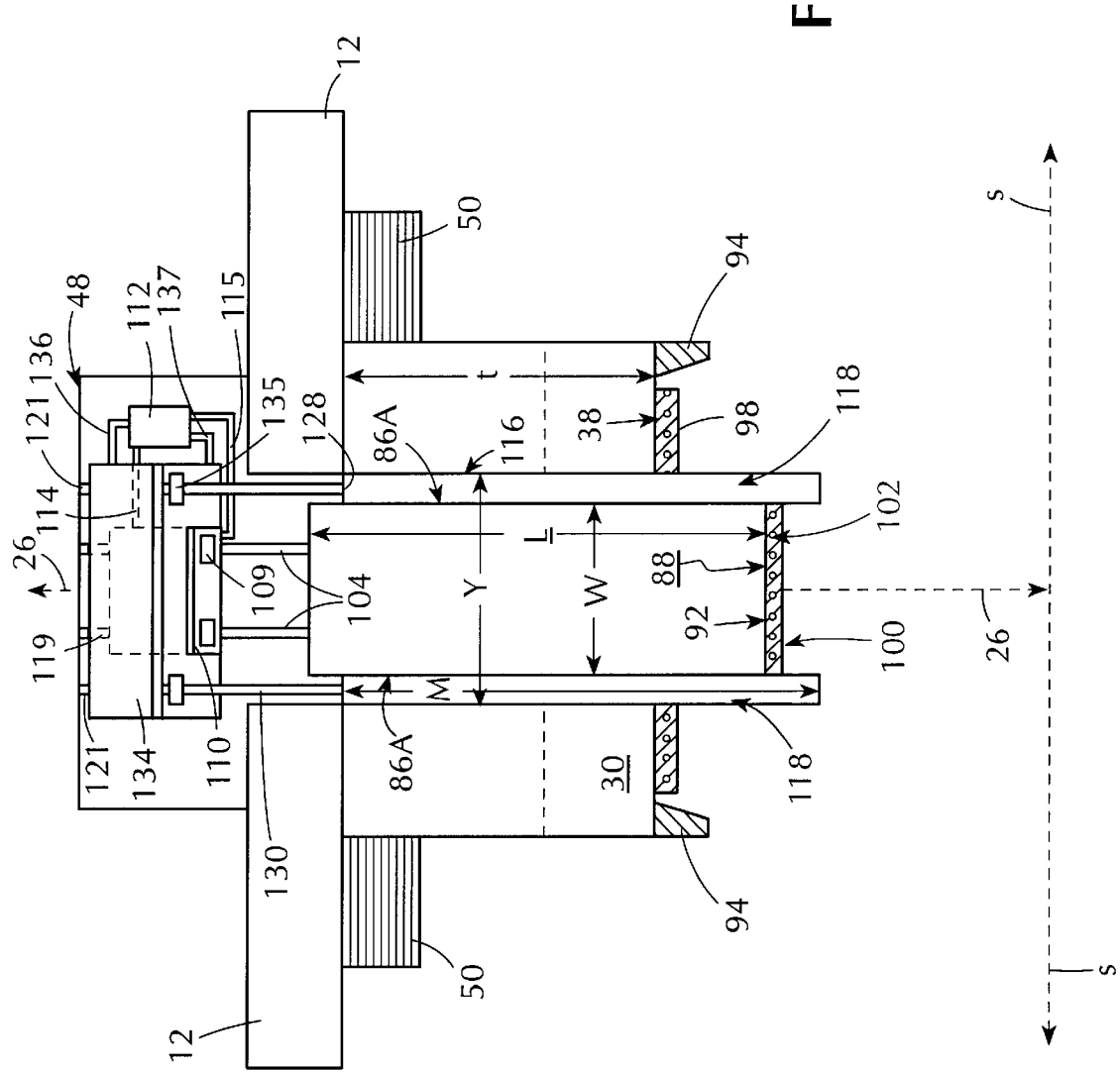
FIG. 4B is a view similar to that of FIG. 4A with the centers of the two pistons shifted away from the symmetrical axis of the polar region.

FIG. 4B shows an alternative embodiment of the polar region shown in FIG. 4A which has the same components, except that the hollowed region 116 in the pole 22 and the aperture 44, although aligned with each other, are not axially symmetric about the polar axis 26. This arrangement of the pistons 88 and 118 translates the region of interest in which scanning in the magnetic zoom mode is performed toward the edge of the pole 22 and away from the polar axis 26 or the pole center. An off-pole center magnetic zoom feature may be desirable in particular surgical applications where scanning of a first region in the normal operation mode of the magnet assembly is desired and scanning of a second smaller region at a higher scanning resolution and at a region of the patient which is shifted from the polar axis 26 is also desired without having to the move the patient on the support 80 or the support 80 itself. This feature is particularly suitable for delicate surgical procedures which require that the patient be maintained absolutely stable throughout and for which it is desired to scan a smaller region of the patient in the magnetic zoom mode and also to scan a larger region, which is not concentric with the smaller region, at a lower scanning resolution in the normal mode of operation.

In another aspect of the invention, magnetic zoom capability in a magnet assembly is provided by coupling an electromagnetic magnetic zoom means to each of the poles. It is also to be understood that the electromagnetic magnetic zoom means can be coupled to each of the poles alone or in combination with a suitable mechanical magnetic zoom means which is also coupled to each of the poles. In one preferred embodiment, the electromagnetic magnetic zoom means may be superconducting.

Figure 6:
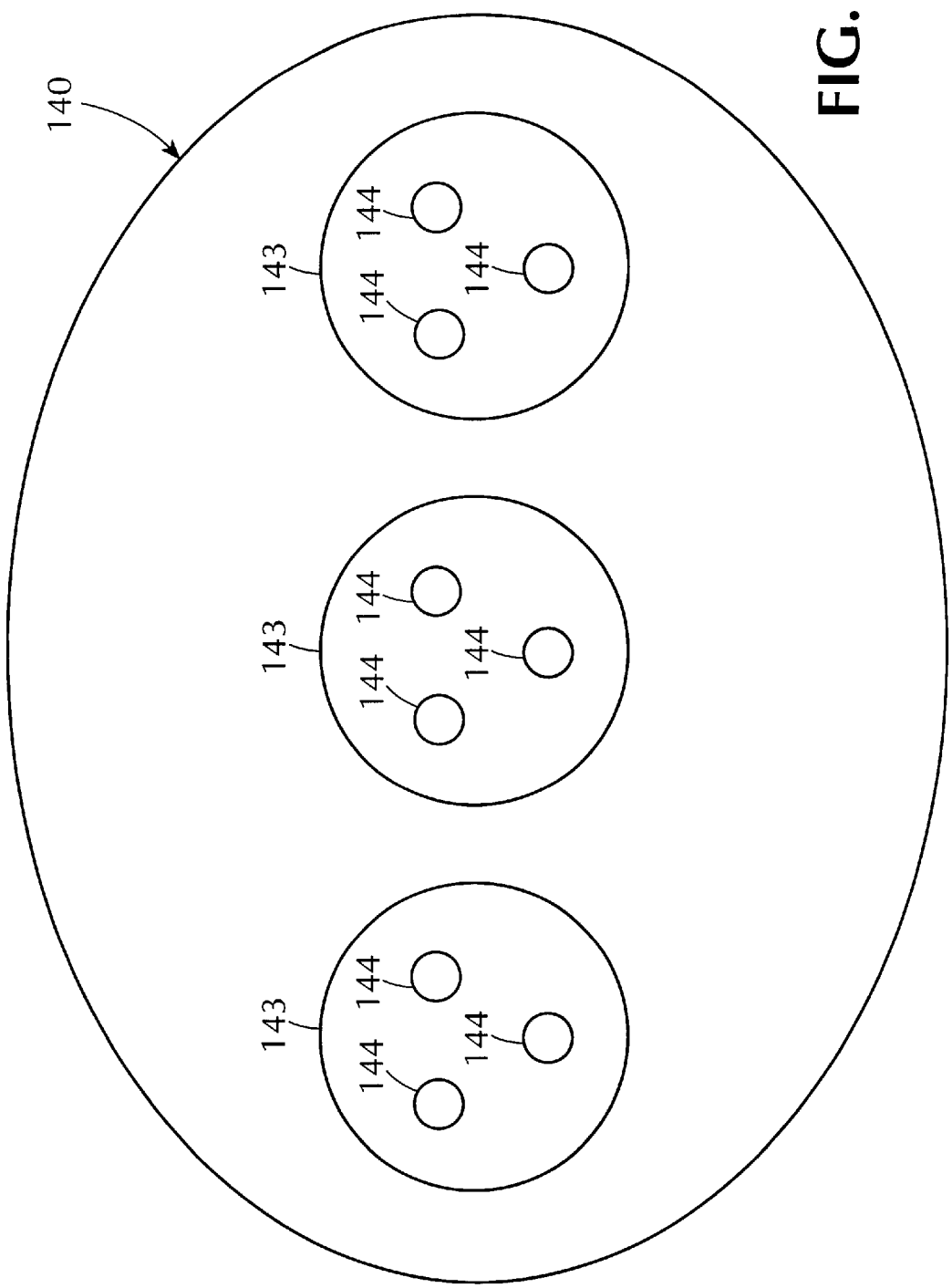
FIG. 6 is a view of the magnetic field gradient coil support of FIG. 5A taken along the section line 6—6.

FIG. 5A illustrates an alternative embodiment of the top polar region of a magnet assembly as shown in FIG. 2B including an electromagnetic magnetic zoom means 146. Referring to FIG. 5A, the pole 22 has the same structure as described above in relation to the embodiment of FIG. 3, except that the hollowed region 86 is completely filled with ferromagnetic material and the surface 28 also includes the surface portion of the filled hollowed region which faces the medial plane S. An insulative support 140 is mounted to the surface 38. The support 140 contains magnetic field gradient coils 142 which have the same structure and operate in the same manner as the coils 98 in the support 100, described above. The support 140 includes several sets 143 of threaded recesses 144 in the surface which faces the gap region 42, as more clearly shown in FIG. 6, which is a plan view of the surface of the support 140 which faces the gap region 42. The sets 143 of recesses 144 are dispersed on the surface of the support 140 which faces the gap region 42.

The electromagnetic magnetic zoom means 146 is a cylindrical disc support. The support 146 includes threaded apertures 148 arranged in the same spatial configuration as the recesses 144 of one of the sets 143 of the recesses 144. Threaded ferromagnetic or steel bolts 150, which are threaded through the apertures 148 and into one of the sets 143 of the recesses 144, securably mount the support 140 to the support 146 and cause the respective facing surfaces to be in close contact with each other. The plurality of the sets 143 of the recesses 144 enables that the support 146 to be mounted at different locations on the support 140 in relation to the polar axis 26.

The support 146 further comprises high density superconducting coils 152 contained in cryostats 154 which are arranged in the support 146 in a manner well known in the art. The coils 152 may be circular, elliptical or rectangular in shape. The coils 152 determine the thickness of the support 146. The support 146 further includes a suitable electrical signal coupling means (not shown) that allows for connection to the system 59.

In operation, when magnetic zoom operation is desired, the physician 62 or another attendant initially secures the support 146 to the support 140 at a selected position in relation to the polar axis 26 by screwing the steel bolts 150 through the apertures 148 and into one of the sets 143 of the recesses 144. The set 143 that is selected would oppose a region of the patient 56 for which scanning at a higher resolution is desired. When the system 56 receives a command to operate in the magnetic zoom mode, the microcontroller provides that a current is initially supplied to the coils 152 to bias the cryostats 154. When suitably powered by the bias current, the coils 152 significantly increase the magnetic field strength through the gap region 42 and a volume region of the patient defined by the surfaces of the supports 146 which would be coupled to each of the poles 22 and 24 and face the plane S. The gap distance for this embodiment of the magnet assembly is the distance between the facing surfaces of the supports 146. This gap distance, like the gap distances for the embodiments of the magnet assemblies operated with magnetic zoom and discussed above, does not substantially impede access to the patient by others.

In one preferred embodiment, a plurality of electromagnetic zoom supports 146 can be mounted on the support 140 simultaneously in accordance with the present invention, and one or more of the supports 146 can be utilized to provide higher scanning resolutions at regions of the patient 56 which face the faces of the pairs of the supports 146, respectively.

In an alternative embodiment, shown in FIG. 5B, the support 146A can have an increased thickness such that the coils 152 are positioned closer to the patient 54, a region of which would be positioned in the plane S. The positioning of the coils 152 closer to the patient 54 increases the magnetic field strength through the smaller region of interest defined by the support 146A and narrows the gap distance within the gap region 42. The support 146A also may contain ferromagnetic material to further increase the magnetic field strength through the smaller region being scanned.

In still another alternative embodiment, the support 146 may be formed only from ferromagnetic material or permanent magnet material and not include the cryostats 154 containing the coils 152. The support 146 would be attached to the support 140 in the same or similar manner as described above in FIG. 5A or FIG. 5B using the bolts 150. The thickness of the support 146 would determine the increase in the scanning resolution obtained for a region of the patient defined by the surface area of the surface of the support 140 which faces the plane S.

Thus, operation in the magnetic zoom mode operation can be achieved by attaching an identical ferromagnetic structure to the facing surfaces 38 and 40 of the poles 22 and 24, respectively, as desired, so that the structure extends a predetermined distance into the gap region 42. Alternatively, an electromagnetic zoom means can be coupled to the surface of a ferromagnetic structure which faces the gap region 42, where the ferromagnetic structure is removably attachable to the surface of the polar region facing the plane S, to provide for even higher resolution scanning.

Figure 7:
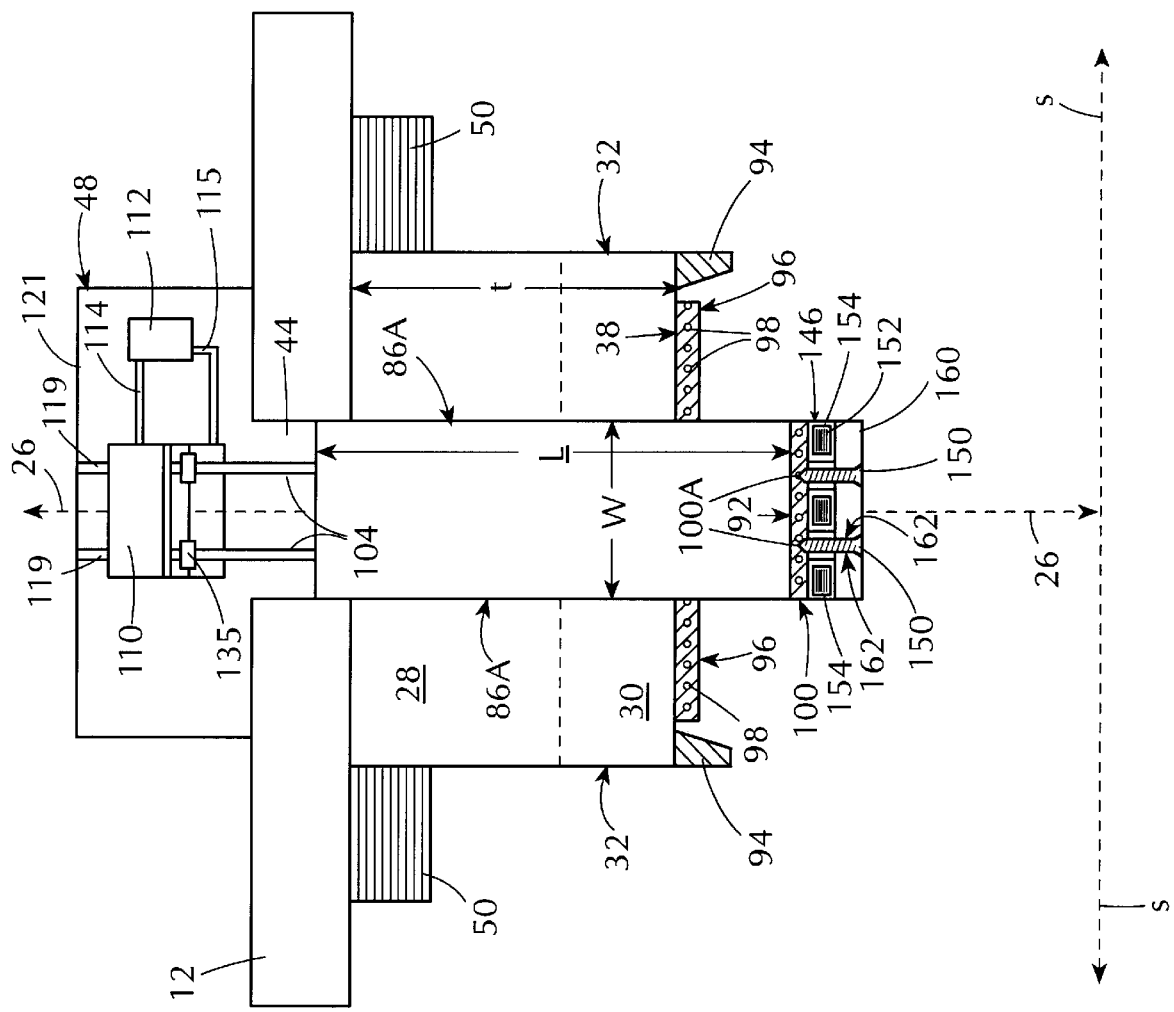
FIG. 7 is a view similar to the that of FIG. 3 having an electromagnetic magnetic zoom means coupled to the piston.

FIG. 7 shows a further preferred embodiment of the magnet assembly as shown in FIG. 3 and including an electromagnetic magnetic zoom means coupled to the piston 88. Referring to FIG. 7, the support 100 is suitably modified to include recesses 100A in the surface of the support 100 which faces the gap region 42. The recesses 100A are disposed in the support 100 so that they can be aligned with the apertures 148 in the support 146. The magnet assembly further includes an RF coil assembly support 160 containing RF receiving and transmitting coils or antennae which are linked (not shown) to the system 58. The RF support 160 includes aperture 162 which are disposed so that they can be aligned with the apertures 148 in the support. The configuration of the recesses 100A, the apertures 148 and the apertures 162 enables the support 146 to be mounted to the support 100 and the support 160 to be mounted to the support 146 using the bolts 150. In a preferred embodiment, the support 146 can be used interchangeably in a magnet assembly which includes the piston 88 as shown in FIG. 7, and in a magnet assembly which does not include a piston coupled to each of the poles, as shown in FIG. 5A.

Figure 8:
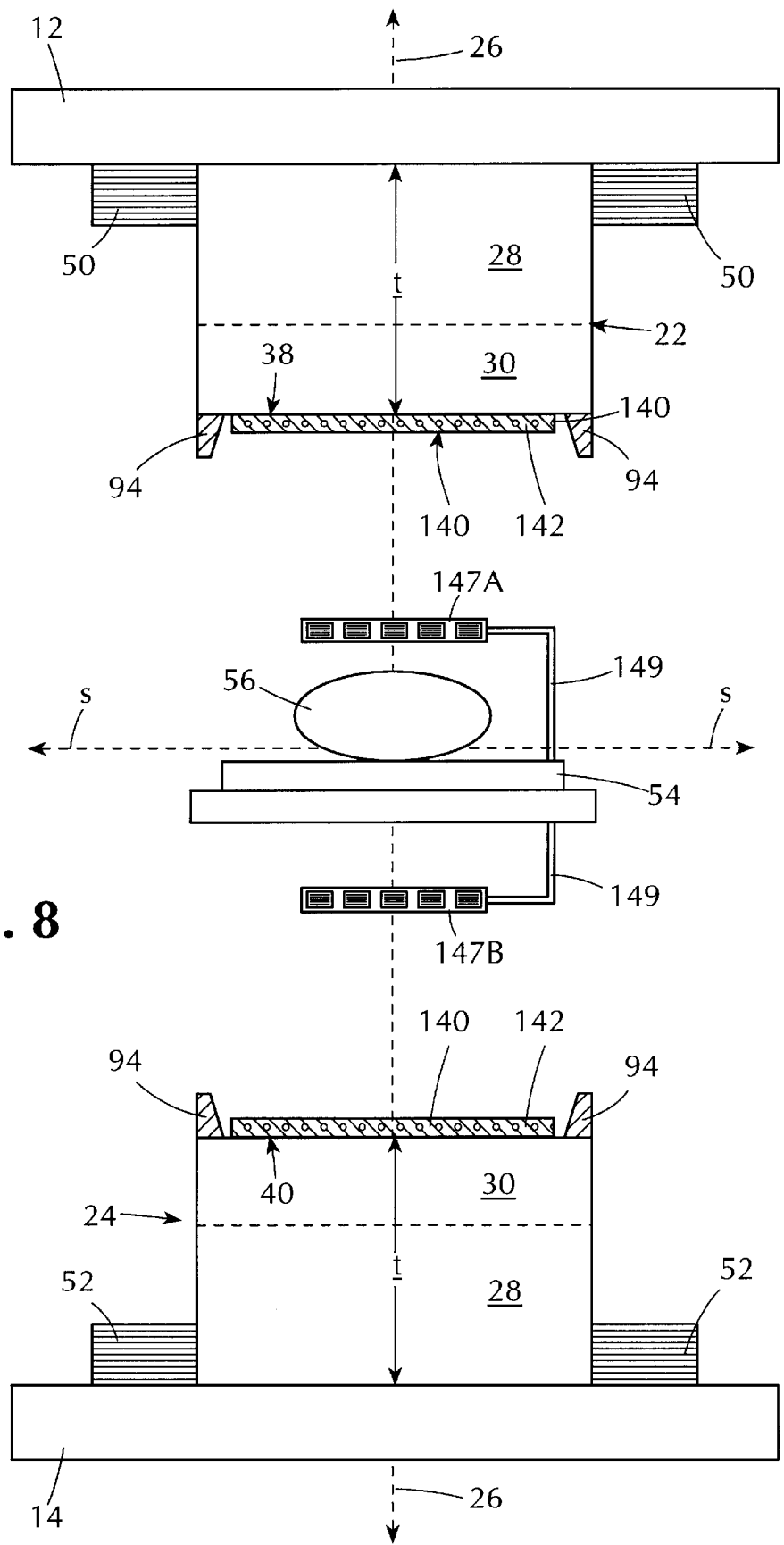
FIG. 8 is a view of the vertical section of the top and bottom polar regions of the magnet assembly as shown in FIG. 2B including independent electromagnet magnet zoom means positioned in the gap region and not mechanically connected to the polar regions.

FIG. 8 shows still a further embodiment of the magnet assembly, as shown in FIG. 2B, including electromagnetic magnetic zoom means 147A and 147B for increasing magnetic field strength in the gap region 42. The poles 22 and 24 have the same structure as described above in relation to the embodiment of FIG. 3, except that the hollowed regions 86 are completely filled with ferromagnetic material and the surfaces 38 and 40 also include the surface portion of the filled hollowed region which faces the medial plane S. The insulative supports 140 are mounted to the surfaces 38 and 40, respectively, as above.

The electromagnetic magnetic zoom means 147A and 147B comprise identical cylindrical discs, which are independent and separate structures from those structures which comprise the polar regions. Flexible support arms 149 attach the discs 147A and 147B to, for example, the bed support 54. The support arms 149, alternatively, can be secured to the floor 66 of the room 10. The flexible support arms 149 can be positioned such that the discs 147A and 147B can be positioned at a plurality of positions in relation to the patient 56 and the polar axis 26. The discs 147A and 147B, preferably, can easily be positioned symmetrical about the plane S.

The discs 147A and 147B comprise high density superconducting coils 152 contained in cryostats 154 which are arranged in a manner well known in the art. Suitable electrical signal coupling means (not shown) link the discs 147A and 147B to the system 58 to provide for energization of the coils 152 therein. When the coils 152 in the discs 147A and 147B are energized, a higher level of scanning resolution of a volume region of the patient 56, which is defined between the facing surfaces of the discs 147A and 147B, is obtained.

Consequently, a magnet assembly in accordance with the present invention can provide for higher resolution scanning of a smaller region of the patient in the gap region, in comparison to the region that is scanned and the resolution of scanning that is obtained in the normal mode operation, by coupling a mechanical or electromagnetic magnetic zoom means, or both, to each of the poles to face the other pole and at a desired position in relation to the polar axis 26, or by positioning independent electromagnetic magnetic zoom means in the gap region proximate a desired region of the patient.

We claim:

1. A magnet assembly for use in medical magnetic resonance imaging comprising:

a ferromagnetic frame including two opposed ferromagnetic elements connected to ends of first and second opposing magnet pole supports, respectively;

means for generating magnetic flux magnetically coupled to the ferromagnetic frame and disposed adjacent to each of the pole supports; and first and second ferromagnetic poles supported by the pole supports and magnetically coupled to the ferromagnetic frame, wherein the poles extend towards each other from the first and second pole supports, respectively, the first and second poles being spaced apart from each other to form a gap region therebetween defined by facing first and second surfaces of the respective poles for receiving a portion of a patient therein and for defining a first portion of the patient for scanning;

wherein the first pole includes a ferromagnetic block having an end surface facing the second pole, the ferromagnetic block being movable toward the surface of the second pole to decrease the size of a portion of the gap region such that magnetic flux is increased in a portion of the gap region, defining a portion of the patient for higher resolution scanning than the first portion of the patient.

2. The magnet assembly of claim 1, wherein the second pole includes a ferromagnetic block having an end surface facing the first pole, the second ferromagnetic block being movable toward the first facing surface of the first pole to decrease the size of a portion of the gap region between facing end surfaces of the first and second ferromagnetic blocks.

3. The magnet assembly of claim 2, wherein the first and second poles are symmetrically aligned with a polar axis and the first and second ferromagnetic blocks are symmetrically aligned with the polar axis.

4. The magnet assembly of claim 2, wherein the first and second poles are symmetrically aligned with a polar axis and the first and second ferromagnetic blocks are symmetrically aligned with an axis which is not aligned with the polar axis.

5. The magnet assembly of claim 1, wherein the ferromagnetic block has a surface facing the other of the poles, the surface having a surface area which is approximately one-fifth of the surface area of the first pole.

6. A method for conducting magnetic resonance imaging comprising:

positioning a portion of a patient in a gap region defined between facing surfaces of first and second opposing poles of a magnet assembly;

positioning a magnetic flux generating means in the gap region, wherein each of the flux generating means includes an end surface facing the opposing pole;

energizing the magnet assembly to generate a magnetic flux density in a first portion of the gap region defined between the end surfaces of the flux generating means, wherein the magnetic flux density is greater than the magnetic flux density generated by energizing the magnet assembly without positioning the flux generating means in the gap region and wherein the first portion of the gap region is smaller than a second portion of the gap region through which magnetic flux density is generated by energizing the magnet assembly without positioning the flux generating means in the gap region; and scanning the portion of the patient at a resolution higher than scanning without positioning the flux generating means in the gap region.

7. The method of claim 6, wherein the step of positioning the flux generating means in the gap region comprises extending into the gap region a ferromagnetic structure which is coupled to each of the poles.

8. The method of claim 6, wherein the step of positioning the flux generating means in the gap region comprises mounting a ferromagnetic structure to the facing surfaces of each of the poles.

9. The method of claim 6, wherein the step of positioning the flux generating means in the gap region comprises mounting an electromagnetic flux generating means to the facing surfaces of each of the poles, and wherein the step of energizing the magnet assembly further comprises energizing the electromagnetic flux generating means.

10. The method claim 9, wherein the electromagnetic flux generating means comprises a support containing superconducting coils.

11. The method of claim 6, wherein the step of positioning the flux generating means in the gap region comprises extending into the gap region a ferromagnetic structure which is coupled to the first pole.

12. The method of claim 6, wherein the step of positioning the flux generating means in the gap region comprises mounting a ferromagnetic structure to the facing surfaces of the first pole.

13. The method of claim 6, wherein the step of positioning the flux generating means in the gap region comprises mounting an electromagnetic flux generating means to the facing surface of the first pole, and wherein the step of energizing the magnet assembly further comprises energizing the electromagnetic flux generating means.

14. A magnet assembly for use in medical magnetic resonance imaging comprising:

a ferromagnetic frame including two opposed ferromagnetic elements connected to ends of first and second opposed magnet pole supports, respectively;

means for generating magnetic flux magnetically coupled to the ferromagnetic frame and disposed adjacent to each of the pole supports;

two opposed ferromagnetic poles magnetically coupled to the ferromagnetic frame, wherein the poles extend from the respective pole supports towards each other along a polar axis extending through the centers of the poles and terminate at facing surfaces, the facing surfaces of the poles being spaced apart from each other to form a gap region therebetween for receiving a portion of a patient therein, wherein each of the poles further comprises opposing outer side walls between the facing surfaces and the adjoining pole support, the opposing outer walls being tapered inwardly towards the polar axis, from the adjoining pole support to the facing surface; and means for changing magnetic flux in the gap region, said means being positionable in the gap region to change said flux.

15. A magnet assembly for use in medical magnetic resonance imaging comprising:
   a ferromagnetic frame including two opposed ferromagnetic elements and two opposed magnet pole supports, each pole support having portions connected to each of the ferromagnetic elements;
   means for generating magnetic flux magnetically coupled to the ferromagnetic frame and disposed adjacent to each of the pole supports;
   first and second opposed ferromagnetic poles, each pole being magnetically coupled to the ferromagnetic frame and extending towards each other from the respective pole supports, the poles being spaced apart from each other to form a gap region therebetween for receiving a portion of a patient therein and defining a first portion of the patient for scanning at a first resolution;
   electromagnetic means for increasing magnetic flux generation in the gap region, the electromagnetic means being positionable in the gap region for defining a volume region in the gap region through which an increased magnetic flux density is directed, the electromagnetic means being independent of and separate from the poles; and
   a support for positioning the electromagnetic means within the gap region.

16. The magnet assembly of claim 15 wherein the support is separate from the poles.

17. The magnet assembly of claim 16, wherein the electromagnetic means comprises ferromagnetic material.

18. A magnet assembly for use in medical magnetic resonance imaging comprising:
   a ferromagnetic frame including two opposed ferromagnetic elements and two opposed magnet pole supports, each pole support being connected to each of the ferromagnetic elements, the frame providing a ferromagnetic path;
   means for generating magnetic flux magnetically coupled to the ferromagnetic frame;
   two opposed ferromagnetic poles magnetically coupled to the ferromagnetic frame, wherein the poles extend towards each other from the respective pole supports and are spaced apart from each other to form a gap region therebetween for receiving a portion of a patient therein; and
   means for changing magnetic flux in the gap region positionable in the gap region and having a surface facing the opposing pole;
   the magnet assembly defining a working space within the frame sufficient to accommodate one or more persons in addition to the patient, whereby the one or more persons in the working space can have access to the patient disposed in the gap.

19. The magnet assembly of claim 18, wherein the means for changing magnetic flux comprises an electromagnetic means.

20. The magnet assembly of claim 18, wherein the means for changing magnetic flux generation comprises a ferromagnetic structure which extends into the gap region from one of the poles towards the other of the poles.

21. The magnet assembly of claim 18, wherein the electromagnetic means comprises superconducting coils.

22. The magnet assembly of claim 18, wherein each pole has a pair of opposing side walls between the adjoining pole support and the facing surface of the pole, the opposing side walls of each pole being inwardly tapered towards the pole face of the respective pole.

23. A magnet assembly for use in medical magnetic resonance imaging comprising:
   a ferromagnetic frame including two opposed ferromagnetic elements connected to ends of first and second opposing magnet pole supports, each pole support having portions connected to each of the ferromagnetic elements;
   means for generating magnetic flux magnetically coupled to the ferromagnetic frame and disposed adjacent to each of the pole supports;
   first and second opposed ferromagnetic poles magnetically coupled to the ferromagnetic frame, wherein the poles extend from the respective pole supports towards each other and are spaced apart from each other to form a gap region therebetween defined by facing surfaces of the respective poles for receiving a portion of a patient therein;
   means for changing magnetic flux in the gap region; and
   a support for the means for changing magnetic flux, the support having a surface mountable to a portion of the facing surface of the first pole, the surface of the support being substantially parallel to the surface of the first pole facing the gap region when the support is mounted to the first pole.

24. The magnet assembly of claim 23, wherein the support comprises superconducting coils.

25. The magnet assembly of claim 24, wherein the support comprises ferromagnetic material.

26. The magnet assembly of claim 23, wherein the support comprises ferromagnetic material.

27. The magnet assembly of claim 23, wherein the surface of the first pole is adapted for mounting of the support in a plurality of locations.

28. The magnet assembly of claim 27, comprising a plurality of mountable supports for being mounted to the first pole in a plurality of locations, concurrently.

29. The magnet assembly of claim 23, wherein the poles extend towards each other along a polar axis extending through the center of the poles, the support being mountable to the first pole, symmetrically with respect to the polar axis,
   the magnet assembly further comprising a second support having a surface mountable to a portion of the facing surface of the second pole, the support including means for changing magnetic flux generation in the gap region, the surface of the second support being substantially parallel to the surface of the second pole facing the gap region, the second support being removably mountable to the second pole, symmetrically with respect to the polar axis.

30. The magnet assembly of claim 23, wherein the poles extend towards each other along a polar axis extending through the center of the poles, the first support being removably mountable to the surface of the first pole at a first location,
   the magnet assembly further comprising a second support having a surface removably mountable to a portion of the facing surface of the second pole at a second location aligned with the first location, wherein an axis through the center of the first and second supports is not aligned with the polar axis, the support including means for changing magnetic flux generation in the gap region, the surface of the second support being substantially parallel to the surface of the second pole facing the gap region.

31. A magnet assembly for use in magnetic resonance imaging comprising:
- a ferromagnetic frame including two opposed ferromagnetic elements and first and second magnet pole supports each pole support being connected to each of the ferromagnetic elements;
- means for generating magnetic flux magnetically coupled to the ferromagnetic frame and disposed adjacent to each of the pole supports;
- a first ferromagnetic pole magnetically coupled to the ferromagnetic frame and extending from the first pole support;
- a second ferromagnetic pole magnetically coupled to the ferromagnetic frame and extending from the second pole support, the first and second ferromagnetic poles extending towards each other and being spaced apart from each other to form a gap region therebetween for receiving a portion of a patient therein;
- wherein the first ferromagnetic pole defines a hollowed region extending from the surface of the pole facing the gap region to the surface of the pole adjacent to the pole support;
- a ferromagnetic piston disposed within the hollowed region and coupled to the pole, the piston having an end surface facing the other pole;
- magnetic field gradient coils mounted at the end surfaces the piston;
- magnetic field gradient coils mounted at the facing surfaces of each of the poles; and
- piston positioning means coupled to the piston and operable to extend the piston towards or away from the gap region, and wherein, when at least a portion of the piston is extended into the gap region, an increased magnetic flux is generated through a portion of the gap region.

32. The magnet assembly of claim 1, further comprising a second ferromagnetic piston magnetically coupled to the first pole, the second piston being hollow and the first ferromagnetic piston being received within the second ferromagnetic piston;
- wherein the piston positioning means is coupled to the second piston and is operable to move the second piston towards and away from the gap region in a predetermined relation to the movement of the first piston towards and away from the gap region.

33. The magnet assembly of claim 1, wherein the second pole defines a second hollowed region extending from the surface of the pole facing the gap region to the surface of the pole adjacent to the pole support, the magnet assembly further comprising:
- a second ferromagnetic piston disposed within the second hollowed region and coupled to the second pole, the second piston having an end surface facing the first pole;
- magnetic field gradient coils mounted at the end surface of the second piston;
- piston positioning means coupled to the piston and operable to extend the second piston towards or away from the gap region, and wherein, when at least portions of the first and second pistons are extended into the gap region, an increased magnetic flux is generated through a portion of the gap region defined between the end surfaces of the first and second pistons.

34. The magnet assembly of claim 33, further comprising:
- a third ferromagnetic piston disposed within the hollowed region of the first pole, magnetically coupled to the first pole, the third piston ferromagnetic being hollow and the first ferromagnetic piston being received within the third ferromagnetic piston;
- magnetic field gradient coils mounted at the end surface of the second piston;
- piston positioning means coupled to the piston and operable to extend the second piston towards or away from the gap region, and wherein, when at least portions of the first and second pistons are extended into the gap region, an increased magnetic flux is generated through a portion of the gap region defined between the end surfaces of the first and second pistons.

35. The magnet assembly of claim 34, further comprising a fourth ferromagnetic piston disposed within the hollowed region of the second pole, magnetically coupled to the second pole, the fourth piston being hollow and the second ferromagnetic piston being disposed within the fourth ferromagnetic piston;
- wherein the second piston positioning means is coupled to the fourth ferromagnetic piston and is operable to move the fourth ferromagnetic piston towards and away from the gap region in a predetermined relation to the movement of the third ferromagnetic piston towards and away from the gap region.

* * * * *